United States Patent
Mizugaki

(10) Patent No.: US 6,597,615 B2
(45) Date of Patent: Jul. 22, 2003

(54) REFRESH CONTROL FOR SEMICONDUCTOR MEMORY DEVICE

(75) Inventor: Koichi Mizugaki, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/935,693

(22) Filed: Aug. 24, 2001

(65) Prior Publication Data

US 2002/0027820 A1 Mar. 7, 2002

(30) Foreign Application Priority Data

Sep. 1, 2000 (JP) ....................... 2000-265053

(51) Int. Cl.[7] .............................. G11C 7/00; G11C 8/00
(52) U.S. Cl. ................. 365/222; 365/233; 365/230.03; 365/227
(58) Field of Search ................................ 365/222, 233, 365/233.5, 230.03, 227

(56) References Cited

U.S. PATENT DOCUMENTS 5,777,942 A * 7/1998 Dosaka et al. ......... 365/230.03
6,028,804 A    2/2000 Leung ..................... 365/222

FOREIGN PATENT DOCUMENTS

JP   A 11-297067   10/1999

* cited by examiner

Primary Examiner—Richard Elms
Assistant Examiner—Jung H. Hur
(74) Attorney, Agent, or Firm—Oliff & Berridge PLC

(57) ABSTRACT

In the operation cycle, memory chip 200 initiates a refresh operation in synchronism with an external clock signal CLK after a refresh timing signal RFTM has been issued. In snooze mode (low power consumption mode), a refresh operation is initiated in response to generation of a refresh timing signal RFTM, regardless of a clock signal CLK.

10 Claims, 25 Drawing Sheets

Fig.2

|  | #CS | ZZ | REFRESH MODE (Note) |
|---|---|---|---|
| OPERATION | L | H | MODE 1 |
| STANDBY | H | H | MODE 1 |
| SNOOZE (POWER DOWN) | H | L | MODE 2 |

(Note)
Refresh mode 1: refresh operation performed in sync with clock signal CLK after refresh timing signal issued in memory chip.

Refresh mode 2: refresh operation performed in response to generation of refresh timing signal in memory chip
(clock signal CLK not required).

INITIATION OF REFRESH OPERATION IN STANDBY CYCLE

Fig.6(a) ICLK 
Fig.6(b) #CS
Fig.6(c) ZZ "H"
Fig.6(d) A0,A1
Fig.6(e) Q54
Fig.6(f) RFTM
Fig.6(g) Q55
Fig.6(h) Q56
Fig.6(i) Q57
Fig.6(j) RFREQ0
Fig.6(k) #EX0 "H"
Fig.6(l) #RF0
Fig.6(m) RESET0

WHOLE CHIP REFRESH OPERATION IN OPERATION CYCLE

Fig. 16

| | #CS | ZZ | REFRESH MODE (Note) |
|---|---|---|---|
| OPERATION | L | H | MODE 1 |
| STANDBY | H | H | MODE 1 |
| SNOOZE (POWER DOWN) | H | L | MODE 2 |

(Note)
Refresh mode 1: refresh operation performed in sync with ATD signal after refresh timing signal issued in memory chip.

Refresh mode 2: refresh operation performed in response to generation of refresh timing signal in memory chip
(address input not required).

INITIATION OF REFRESH OPERATION IN STANDBY CYCLE

INITIATION OF REFRESH OPERATION IN OPERATION CYCLE

Fig.22(a) ATD
Fig.22(b) #CS
Fig.22(c) ZZ
Fig.22(d) A0~A19
Fig.22(e) Q54
Fig.22(f) RFTM
Fig.22(g) Q55
Fig.22(h) Q56
Fig.22(i) Q57
Fig.22(j) RFREQ0
Fig.22(k) #EX0
Fig.22(l) #RF0
Fig.22(m) RESET0

INITIATION OF REFRESH OPERATION IN SNOOZE MODE

REFRESH CONTROL FOR SEMICONDUCTOR MEMORY DEVICE

BACKGROUND OF THE INVENTION

1. Field of the Invention

The present invention relates to refresh control in a semiconductor memory device.

2. Description of the Related Art

Commonly used semiconductor memory devices include DRAM and SRAM. It is common knowledge that while DRAM offers higher capacity at lower price than SRAM, it requires refresh operations. SRAM, on the other hand, while easier to use due to the lack of a need for refresh operations, is more expensive and has lower capacity than DRAM.

Virtual SRAM (known as VSRAM or PSRAM) is a semiconductor memory device that offers those advantages of both DRAM and SRAM. Virtual SRAM has a memory cell array composed of dynamic memory cells identical to those in DRAM, and also houses a refresh controller allowing refresh operations to be performed internally. Thus, external devices connected to virtual SRAM (such as a CPU) can access (i.e., read or write data) virtual SRAM without being aware of refresh operations. This feature of virtual SRAM is known as "refresh transparency."

Certain types of virtual SRAM can assume a plurality of operating modes, such as a normal operating mode and a power saving mode. The issue of how internal refresh operations should be performed in virtual SRAM in each of these operating modes has not been given adequate consideration. This problem is not limited to so-called virtual SRAM, and is a problem common to all types of dynamic semiconductor memory devices that have an internal refresh timer and refresh controller.

SUMMARY OF THE INVENTION

An object of the present invention is to enable refresh operations to be carried out optimally in each of a plurality of available operating modes of a semiconductor memory device.

In order attain at least part of the above and related objects of the present invention, there is provided a semiconductor memory device having a plurality of operating modes. The semiconductor memory device comprises a memory cell array having dynamic memory cells, a refresh controller, an operation mode input terminal, and an external timing input terminal. The refresh memory controller has a refresh timer for generating a refresh timing signal used to determine timing for performing refresh operations on the memory cell array. The refresh controller performs refresh operations on the memory cell array in response at least to the refresh timing signal. The operating mode input terminal is configured to receive from an external device an operating mode signal specifying one of the plurality of operating modes of the semiconductor memory device. The external timing input terminal is configured to receive from the external device an external timing signal that is to be used together with the refresh timing signal when the refresh controller determines the timing for performing the refresh operations.

The refresh controller performs internal refresh operations in two refresh modes. In an event that the operating mode signal specifies a first operating mode, the refresh controller performs an internal refresh operation according to a first refresh mode wherein a refresh operation on the memory cell array is initiated under timing determined by the external timing signal after the refresh timing signal has been generated. In an event that the operating mode signal specifies a second operating mode, on the other hand, the refresh controller performs an internal refresh operation according to a second refresh mode wherein a refresh operation on the memory cell array is initiated in response to generation of the refresh timing signal, regardless of the external timing signal.

In first operating mode, an internal refresh operation is initiated under timing determined by an external timing signal, thereby facilitating arbitration of access operations by external devices and internal refresh operations by the refresh controller. In second operating mode, an internal refresh operation is initiated in response to generation of a refresh timing signal, regardless of an external timing signal, thereby enabling internal refresh operations even in the absence of external timing signal input. Thus, refresh operations in this semiconductor memory device are performed in suitable ways for each of the plurality of operating modes.

These and other objects, features, aspects, and advantages of the present invention will become more apparent from the following detailed description of the preferred embodiments with the accompanying drawings.

BRIEF DESCRIPTION OF THE DRAWINGS

FIG. 2 is a illustrative diagram showing the operating modes of memory chip 200 associated with different levels of chip select signal #CS and snooze signal ZZ.

FIG. 16 is a illustrative diagram showing the different operating states of the memory chip 300 of Embodiment 2.

DESCRIPTION OF THE PREFERRED EMBODIMENT

Figure 1:
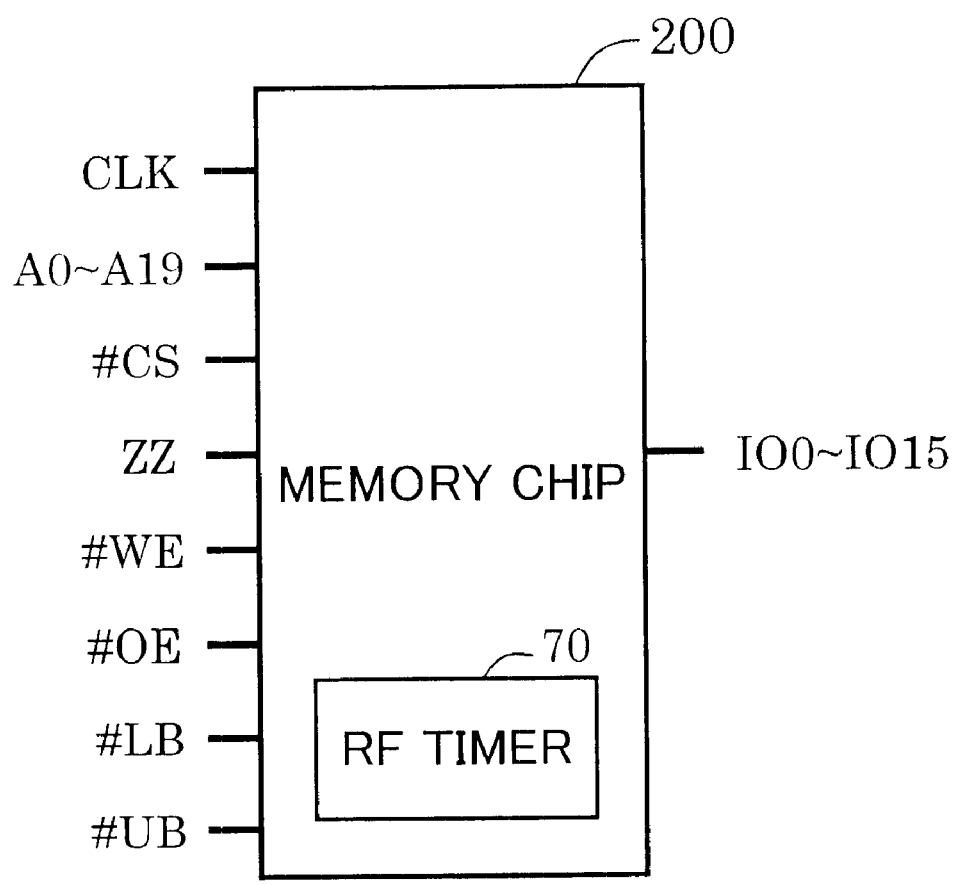
FIG. 1 is a illustrative diagram showing the pinout of a memory chip 200 pertaining to Embodiment 1 of the invention.
Figure 3:
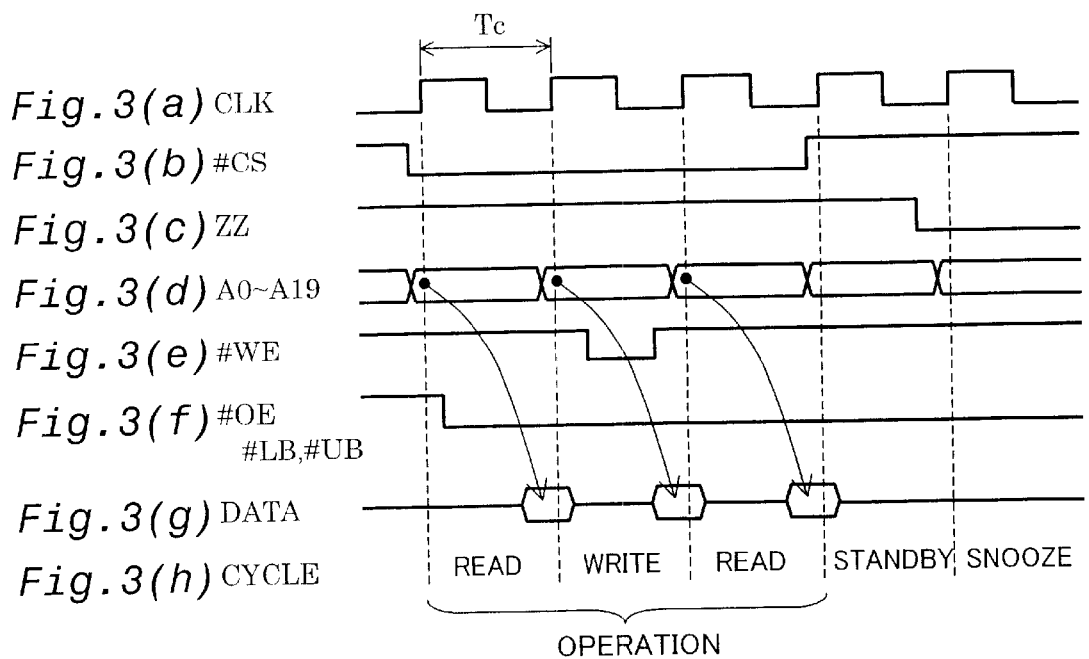
FIGS. 3(a)–3(h) are timing charts summarizing operation of memory chip 200 in Embodiment 1.

The embodiments of the invention are described in the following order.
A. Embodiment 1
   A1: Summary of memory chip pinout and operating modes
   A2: Overall circuit configuration
   A3: Internal configuration and operation of refresh controller
   A4: Whole chip refresh operation
B. Embodiment 2
C. Application in an electronic device
D. Modifications
A. Embodiment 1
A1: Summary of Memory Chip Pinout and Operating Modes FIG. 1 is an illustrative diagram showing the pinout of a memory chip 200 pertaining to Embodiment 1 of the invention. Memory chip 200 has the following terminals.

CLK: clock input terminal (1 pin)
   A0–A19: address input terminals (20 pins)
   #CS: chip select input terminal (1 pin)
   ZZ: snooze input terminal (1 pin)
   #WE: write enable input terminal (1 pin)
   #OE: output enable input terminal (1 pin)
   #LB: lower byte enable input terminal (1 pin)
   #UB: upper byte enable input terminal (1 pin)
   IO0–IO15: I/O data terminals (16 pins)

In the following discussion the same symbols are used to denote both the terminals and the signals. A "#" preceding a terminal name (or signal name) denotes negative logic. While a plurality of address input terminals A0–A19 and I/O data terminals IO0–IO15 are provided, these are depicted in simplified form in FIG. 1.

Memory chip 200 is configured to function as virtual SRAM (VSRAM) so as to enable access in substantially the same manner as SRAM. Memory chip 200 has an internal refresh controller that includes a refresh timer 70. Herein, data read and write operations by external devices (referred to as "memory control devices" or "control devices") shall be referred to as "external access" and refresh operations performed by the internal refresh controller shall be referred to as "internal refresh" operations or simply "refresh" operations.

Clock signal CLK is used as a sync signal for synchronizing initiation of external access with initiation of internal refresh operations. Specifically, A0–A19 addresses and chip select signal #CS are input from external devices in sync with clock signal CLK. Normally, internal refresh operations are also synchronized with clock signal CLK. The internal refresh controller controls external access and internal refresh operations in sync with this clock signal CLK.

Herein, the expression, "a certain signal is synchronized with clock signal CLK" does not necessarily refer to the signal being generated in sync with the edge of the clock signal CLK, and in some instances may refer to a situation where there is a predetermined time relationship between the edge of the clock signal CLK and issuing of the signal.

Chip select signal #CS and snooze signal ZZ are used to control the operating mode of chip 200. FIG. 2 shows the operating modes of memory chip 200 associated with different levels of chip select signal #CS and snooze signal ZZ. Herein, "H level" refers to "1" level of a binary signal and "L" level refers to "0" level.

When chip select signal #CS is L level (active) and snooze signal ZZ is H level, a read/write operation cycle (hereinafter referred to simply as "operation cycle" or "read/write cycle") is performed. Reading of data from and writing of data to chip 200 are performed during the read/write cycle.

When chip select signal #CS and snooze signal ZZ are both H level, a standby cycle is performed. In the standby cycle all word lines are in the inactive state. However, word lines indicated by refresh addresses will be activated during internal refresh operations.

When chip select signal #CS is H level (inactive) and snooze signal ZZ is L level, memory chip 200 goes into snooze mode (also termed "power down mode"). In snooze mode all circuits not needed for refresh operations are halted. In snooze mode clock signal CLK is suspended within memory chip 200. Since power consumption in snooze mode is very low, it is suited to backup of data held in memory.

Refresh operations are performed according to first refresh mode in the operation cycle and refresh cycle, and according to second refresh mode in snooze mode. In first refresh mode, refresh operations are initiated in sync with the clock signal CLK after the refresh timer 70 has generated a refresh timing signal. In second refresh mode, refresh operations are initiated instantaneously when the refresh timer 70 generates a refresh timing signal. Since refresh operations in second refresh mode are not synchronized with clock signal CLK, no clock signal CLK is needed. In this way the memory chip 200 performs refresh operations according to refresh modes suitable for each of the three operating modes. Refresh operations in the two refresh modes will be described in greater detail later.

As will be apparent from the preceding description, chip select signal #CS and snooze signal ZZ act as "operating mode signals specifying an operating mode for the semiconductor memory device" in the present invention. The clock signal CLK acts as "external timing signal used together with a refresh timing signal when determining the timing for performing refresh operations" in the present invention.

Signals other than the three signals CLK, #CS, ZZ described above are substantially identical to those used in ordinary memory chips. Address A0–A19 enables 20-bit megaword addressing. I/O data IO0–IO15 represent 16-bit word data. That is, one value of address A0–A19 corresponds to 16 bits (1 word), enabling 16 bits of I/O data IO0–IO15 to be input or output at any one time.

In the operation cycle, when the write enable signal #WE goes to L level a write cycle is performed, and when it goes to H level a read cycle is performed. When output enable signal #OE goes to L level, output by I/O terminals IO0–IO15 is enabled. Lower byte enable signal #LB and upper byte enable signal #UB are control signals for performing a read or write of only one byte, either the lower byte or the upper byte of a word (16 bits). For example, when lower byte enable signal #LB is set to L level and upper byte enable signal #UB is set to H level, only the lower 8 bits of a word will be read or written. The power supply terminals are not shown in FIG. 1.

FIGS. 3(a)–3(h) are timing charts summarizing operation of memory chip 200 in Embodiment 1. Which of the three states in FIG. 2 (operation, standby, or snooze) the device is in is determined in sync with the rising edge of clock signal CLK. The first three cycles shown in FIGS. 3(a)–3(h) make up an operation cycle. In the operation cycle, either a read (read cycle) or write (write cycle) is performed depending on the level of write enable signal #WE. One cycle period Tc of clock signal CLK is the same as the cycle time (also termed "cycle period") of memory chip 200. Clock cycle Tc is set within the range of about 50 ns to about 100 ns, for example.

In the fourth cycle in FIGS. 3(a)–3(h), chip select signal #CS rises to H level whereupon standby cycle is initiated. In the fifth cycle, snooze signal ZZ additionally drops to L level, whereupon memory chip 200 enters snooze mode.

Of the signals shown in FIGS. 3(a)–3(h), chip select signal #CS and an address A0–A19 are input from an external device (such as the CPU) in sync with clock signal CLK. Specifically, chip select signal #CS and address A0–A19 are input to memory chip 200 preceding the rising edge of clock signal CLK by a predetermined time interval (setup time). The reason for doing so is so that the values of signals #CS and A0–A19 are well established at the rising edge of clock signal CLK.

A2: Overall Circuit Configuration

Figure 4:
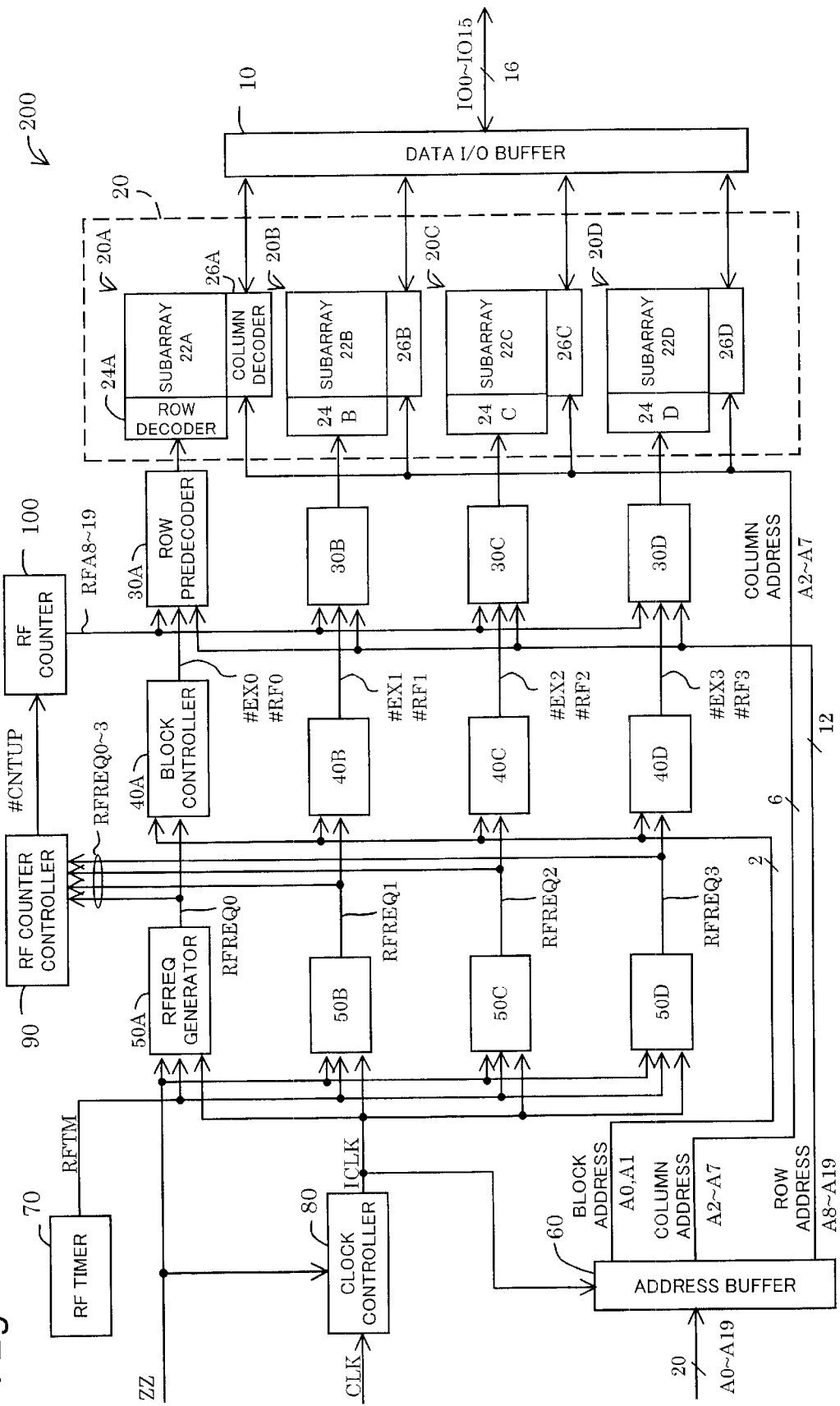
FIG. 4 is a block diagram showing the internal configuration of memory chip 200.

FIG. 4 is a block diagram showing the internal configuration of memory chip 200. Memory chip 200 comprises a data I/O buffer 10, a memory cell array 20, and an address buffer 60. Memory cell array 20 is divided into four blocks 20A–20D. The first block 20A has a memory cell subarray 22A, a row decoder 24A, and a column decoder 26A. The other blocks 20B–20D are analogous in configuration. As the configuration of blocks 20A–20D is the same, the following discussion shall focus principally on the first block 20A and its related circuitry.

The arrangement of a block 20A is analogous to that of a typical DRAM memory cell array. Subarray 22A includes a plurality of 1-transistor/1-capacitor type memory cells in a matrix array. Each memory cell is connected to a word line and a pair of bit lines. A precharge circuit, sense amp, etc. (not shown) are also provided in subarray 22A. Row decoder 24A selects and activates one of the plurality of word lines in subarray 22A. Column decoder 26A simultaneously selects bit line pairs equivalent to one word (16 bits) from among the plurality of bit line pairs in subarray 22A. Thus, input of a single address A0–A19 by an external device enables simultaneous access of 16 bits (1 word) of data in one block.

Address buffer 60 shown in the bottom left corner of FIG. 4 inputs a 20-bit address A0–A19. In sync with clock signal CLK, address A0–A19 is latched in address buffer 60 and supplied to other circuits. The lower 2-bit address A0–A1 is used as a block address for selecting one of the four blocks 20A–20D. The next 6-bit address A2–A7 above block address A0–A1 is used as the column address, and the remaining 12-bit address A8–A19 is used as the row address. Thus, one of the four blocks 20A–20D is selected by means of block address A0–A1, and from the selected block one word (16 bits) of data is selected by means of column address A2–A7 and row address A8–A19. The selected word of data is either read or written via data I/O buffer 10.

To the one block 20A are connected, in series, a row predecoder 30A, a block controller 40A, and a refresh request signal generating circuit 50A. The other blocks 20B–20D are of the same configuration. Within memory chip 200 are additionally provided a refresh timer 70, a clock controller 80, a refresh counter controller 90, and a refresh counter 100.

Refresh timer 70 is a circuit that generates a refresh timing signal RFTM according to a predetermined refresh cycle period. Refresh timer 70 is composed of a ring oscillator, for example. The refresh cycle is set to about 32 $\mu$s, for example.

When snooze signal ZZ is H level, clock controller 80 generates an internal clock signal ICLK from the clock signal CLK input from an external device, and supplies this to the other circuits in memory chip 200. The internal clock signal ICLK has the same cycle as the external clock signal CLK and is a lower duty signal. For example, while the duty of the external clock signal CLK is about 50%, the duty of the internal clock signal ICLK is about 3%. Thus, in the following discussion "synchronized with the internal clock signal ICLK" indicates synchronization with the external clock signal CLK as well. The reason for using a low duty internal clock signal ICLK is to facilitate synchronization with the clock signal in memory chip 200. Alternatively, it is possible to dispense with the internal clock signal ICLK and simply use the external clock signal CLK per se.

When snooze signal ZZ is L level, clock controller 80 ceases supplying internal clock signal ICLK. Thus, in snooze mode, other circuits in memory chip 200 cease to be supplied with internal clock signal ICLK even if external clock signal CLK is input to the chip. As a result, in snooze mode, operation of circuits—other than those for performing internal refresh operations—is suspended, allowing power consumption to be reduced appreciably. Hereinafter the internal clock signal ICLK shall be referred to simply as "clock signal ICLK."

Refresh request signal generating circuits 50A–50D generate refresh request signals RFREQ0–RFREQ3 for each block 20A–20D in response to a refresh timing signal RTFM supplied by refresh timer 70. These refresh request signals RFREQ0–RFREQ3 are provided respectively to the corresponding block controllers 40A–40D.

Block controllers 40A–40D are supplied with refresh request signals RFREQ0–RFREQ3 as well as with a block address A0–A1 supplied by an external device. Refresh request signals RFREQ0–RFREQ3 indicate that refresh operations should be initiated in the four blocks 20A–20D. In the operating cycle the block address A0–A1 indicates for which of the four blocks 20A–20D external access is requested. In response to signals RFREQ0–RFREQ3 and block address A0–A1, block controllers 40A–40D arbitrates external access and internal refresh operations for the four blocks. Specifically, the arbitration is exercised by setting the levels of external access signals #EX0–#EX3 and refresh signals #RF0–#RF3.

In response to the signal levels of external access signals #EX0–#EX3 and refresh signals #RF0–#RF3, row predecoders 30A–30D each select either a row address A8–A19 input from the external device or a refresh address RFA8–RFA19 supplied by refresh counter 100, and supply it to a row decoder 24A–24D. Address selection is performed independently by each row predecoder. For example, in the event that a request for external access to first block 20A is made at the same time as a refresh request, the first row predecoder 30A selects row address A8–A19 and supplies it to the first block 20A, while the other row predecoders 30B–30D select refresh address RFA8–RFA19 and supply it to the corresponding blocks 20B–20D.

The configuration and operation of refresh request signal generating circuits 50A–50D, block controllers 40A–40D, and row predecoders 30A–30D will be discussed later.

Refresh counter controller 90 detects whether refresh operations for the same given refresh address have been completed in all four blocks 20A–20D. As will be described later, detection is accomplished by checking for changes in the levels of the four refresh request signals RFREQ0–RFREQ3. When refresh operations in all four blocks 20A–20D have been completed the refresh counter controller 90 supplies a countup signal #CNTUP to refresh counter 100. In response to countup signal #CNTUP, refresh counter 100 then increments by 1 the value of refresh address RFA8–RFA19.

In addition to the circuits depicted in FIG. 4, memory chip 200 also has a controller for controlling the operating mode of circuits in the chip according to chip select signal #CS and snooze signal ZZ, and another controller for controlling I/O status according to the enable signals #WE, #OE, #LB, and #UB; however, for convenience these have been omitted in FIG. 4.

Of the circuits depicted in FIG. 4, circuitry other than the memory cell array 20, data I/O buffer 10, address buffer 60, and clock controller 80 (i.e., 30A–30D, 40A–40D, 50A–50D, 70, 90, and 100) as a whole act as "refresh controller" in the present invention. In particular, the circuitry composed of row predecoders 30A–30D, block controllers 40A–40D, and refresh request signal generating circuits 50A–50D has the function of arbitration circuitry for arbitrating internal refresh and external access operations.

A3: Internal Configuration and Operation of Refresh Controller

Figure 5:
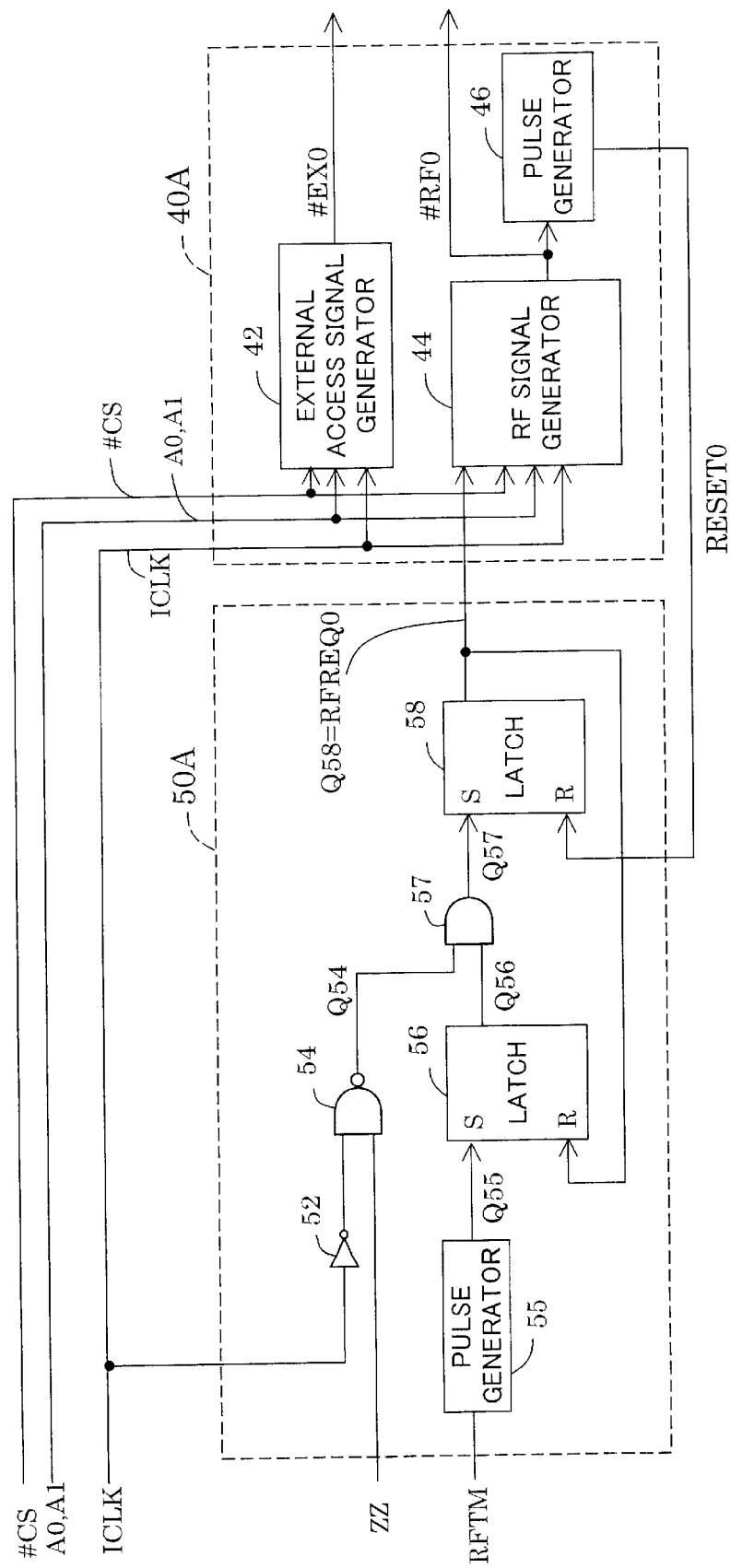
FIG. 5 is a block diagram showing the internal configuration of refresh request signal generating circuit 50A and block controller 40A.

FIG. 5 is a block diagram showing the internal configuration of refresh request signal generating circuit 50A and block controller 40A. The other refresh request signal generating circuits 50B–50D and other block controllers 40B–40D have the same arrangement.

Refresh request signal generating circuit 50A comprises an inverter 52, a NAND gate 54, a pulse generating circuit 55, two latching circuits 56, 58 and an AND gate 57.

One of the input terminals of NAND gate 54 has snooze signal ZZ as input, while the other input terminal has as input the clock signal ICLK which has been inverted by inverter 52. The output Q54 of NAND gate 54 is provided as input to AND gate 57.

Pulse generating circuit 55 generates a pulse signal Q55 in response to the rising edge of refresh timing signal RFTM. This pulse generating circuit 55 consists, for example, of a one-shot multivibrator. Pulse signal Q55 is presented to the set input terminal of first latch 56. The output Q56 of first latch 56 is input to AND gate 57 together with the output Q54 of NAND gate 54. The output Q57 of AND gate 57 is supplied to the set input terminal of the second latch 58. The output Q58 of second latch 58 is supplied as a refresh request signal RFREQ0 to block controller 40A, and is also input to the reset input terminal of first latch 56.

Block controller 40A comprises an external access signal generating circuit 42, a refresh signal generating circuit 44, and a pulse generating circuit 46. External access signal generating circuit 42 has as inputs the chip select signal #CS, block address A0–A1, and clock signal ICLK. The refresh signal generating circuit 44 has as inputs #CS, A0–A1, and ICLK, as well as the refresh request signal RFREQ0.

External access signal generating circuit 42 decides, in response to the rising edge of the clock signal ICLK, if there is a request for external access to the block 20A associated with block controller 40A. This decision is made on the basis of chip select signal #CS and block address A0–A1. Specifically, when chip select signal #CS is L level (active) and block address A0–A1 is "00", it is decided that there is a request for external access to block 20A. At this time external access signal generating circuit 42 sets the external access signal #EX0 to L level (active). In the absence of a request for external access to block 20A, external access signal generating circuit 42 sets the external access signal #EX0 to inactive (H level).

Like external access signal generating circuit 42, refresh signal generating circuit 44 decides whether there is a request for external access to the block 20A. In the absence of a request for external access to block 20A, if there is a refresh request, refresh signal generating circuit 44 sets refresh signal #RF0 to L level (active). In the absence of both a request for external access and a refresh request, refresh signal #RF0 is set to H level (inactive). When refresh signal #RF0 becomes active, a refresh operation in block 20A is initiated.

In the event of a request for external access to block 20A, refresh signal #RF0 is set to H level (inactive) even if there is a refresh request. Refresh signal #RF0 is subsequently held at H level until external access of block 20A is completed, and once external access is complete it is set to L level (active). There are two instances of completion of external access of block 20A: a first instance wherein there is a request for external access to a block other than block 20A, and a second instance wherein chip select signal #CS goes to H level (inactive) and standby mode is assumed. At each rising edge of clock signal ICLK, refresh signal generating circuit 44 checks which of these two instances has occurred, and at the point in time at which either has occurred, sets the refresh signal #RF0 to L level (active). In this way, at the point in time that refresh signal #RF0 becomes active, the refresh operation in block 20A is initiated.

Pulse generating circuit 46 generates a short-pulse reset signal RESET0 in response to the rising edge of refresh signal #RF0. This pulse generating circuit 46 consists, for example, of a one-shot multivibrator. Reset signal RESET0 is presented to the reset input terminal of second latch 58.

FIGS. 6(a)–6(m) are timing charts showing initiation of a refresh operation in the standby cycle. In standby cycle, snooze signal ZZ (FIG. 6(c)) is H level, so clock signal ICLK is input to AND gate 57 via NAND gate 54 (FIG. 6(e)).

At time t1, a refresh timing signal RFTM (FIG. 6(f)) supplied by refresh timer 70 rises to H level, whereby refresh request signal generating circuit 50A is notified of the need to initiate a refresh operation. When refresh timing signal RFTM rises to H level at time t1, a pulse signal Q55 (FIG. 6(g)) is generated, in response to which the output Q56 (FIG. 6(h)) of first latch 56 also rises to H level.

Figure 6:
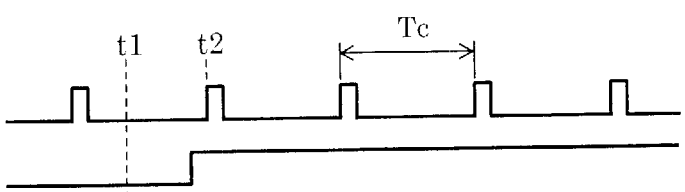
FIGS. 6(a)–6(m) are timing charts showing initiation of a refresh operation in the standby cycle.

At time t2 of the next rising edge of clock signal ICLK the output Q56 (FIG. 6(h)) of first latch 56 is maintained at H level. Accordingly, the output Q57 (FIG. 6(i)) of AND gate 57 rises to H level in response to the change in the output Q54 of NAND gate 54, setting the second latch 58. As a result, the output of second latch 58, namely refresh request signal RFREQ0 (FIG. 6(*j*)) rises to H level.

Further, since chip select signal #CS and snooze signal ZZ are both at H level at time t2, a standby cycle is performed subsequent to time t2 so no external access is performed. Thus, external access signal generating circuit 42 maintains external access signal #EX0 (FIG. 6(*k*)) at H level (inactive).

In response to refresh request signal RFREQ0, refresh signal generating circuit 44 sets refresh signal #RF0 (FIG. 6(*l*)) to L level (active). Once enough time for the refresh operation has subsequently elapsed, refresh signal generating circuit 44 brings refresh signal #RF0 back up to H level (inactive). In response to the rising edge of refresh signal #RF0, pulse generating circuit 46 generates a reset signal RESET0 pulse (FIG. 6(*m*)). This reset signal RESET0 is presented to the reset input terminal of second latch 58, so refresh request signal RFREQ0 returns to L level (inactive) in response to the reset signal RESET0 pulse.

Since refresh request signal RFREQ0 is also input to the reset input terminal of first latch 56, this latch 56 resets in response to the rise in refresh request signal RFREQ0 (FIG. 6(*h*)). As a result, clock signal ICLK is inhibited by AND gate 57, and the output Q57 of AND gate 57 drops to L level.

The first refresh operation is initiated after the rising edge of clock signal ICLK at time t2, and is completed within one cycle Tc of clock signal ICLK (i.e., within one memory cycle). Accordingly, even if a refresh operation is being performed in standby cycle, in the event that there is a request for external access at the next rising edge of clock signal ICLK, immediate external access will be enabled.

Figure 7:
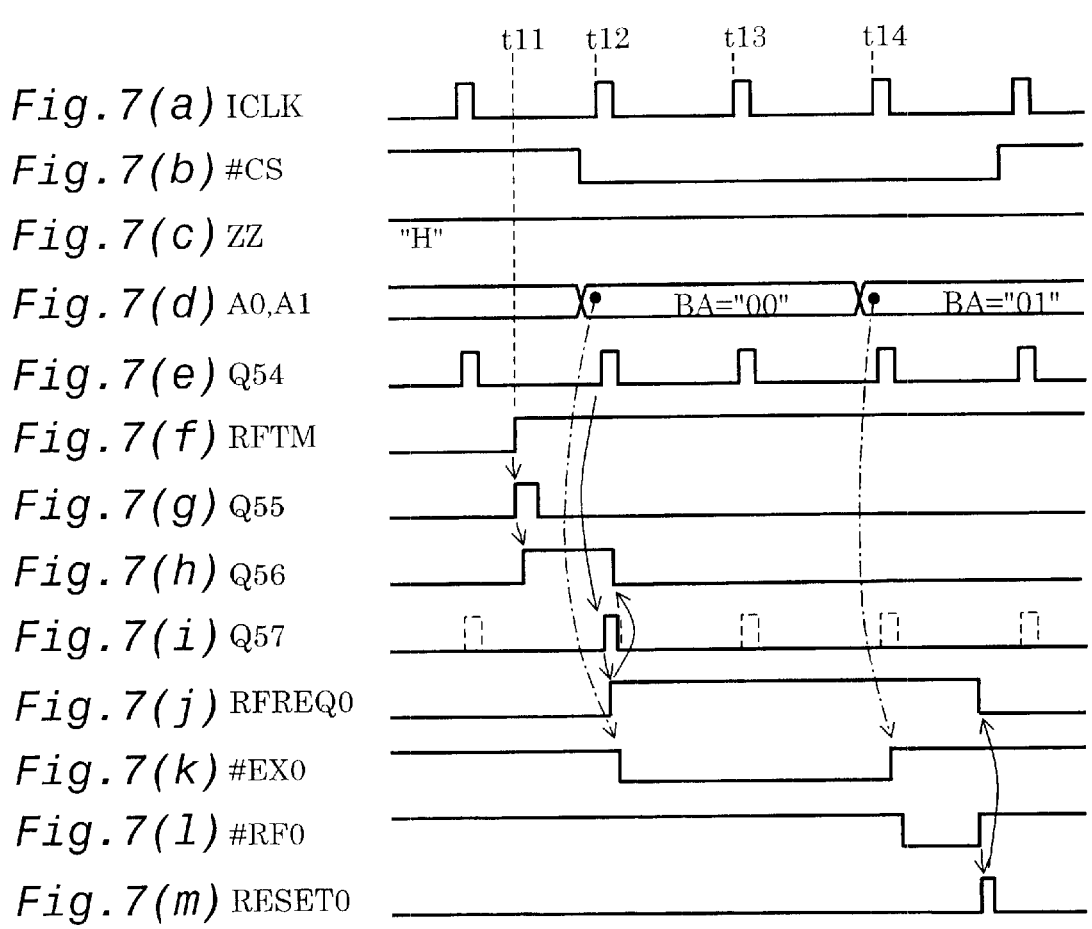
FIGS. 7(a)–7(m) are timing charts for initiation of a refresh operation in the operation cycle.

FIGS. 7(*a*)–7(*m*) are timing charts for initiation of a refresh operation in the operation cycle. After refresh timing signal RFTM (FIG. 7(*f*)) rises to H level at time t11, refresh request signal RFREQ0 (FIG. 7(*j*)) rises to H level at the time t12 of the next rising edge of clock signal ICLK. Operation up to this point is analogous to that in the standby cycle depicted in FIGS. 6(*a*)–6(*m*).

In the example of FIGS. 7(*a*)–7(*m*), chip select signal #CS is L level at time t12, and thus the operation cycle is performed subsequent to time t12. Here, the block address A0–A1 value is "00" and external access to first block 20A is requested. Accordingly, external access signal generating circuit 42 (FIG. 5) sets external access signal #EX0 (FIG. 7(*k*)) to L level (active), while refresh signal generating circuit 44 maintains refresh signal #RF0 (FIG. 7(*l*)) at H level (inactive) for a while.

At the time t13 of the next rising edge of clock signal ICLK, since external access of block 20A is ongoing, there is no change in the level of external access signal #EX0 or of refresh request signal RFREQ0. At the time t14 of the next rising edge, block address A0–A1 changes to one indicating external access to second block 20B. Thus, in the cycle subsequent to time t14 the external access signal #EX0 for first block 20A goes to H level (inactive), and refresh request signal RFREQ0 goes to L level (active). As a result, in the cycle subsequent to time t14 the refresh operation is performed on the first block 20A. The refresh operation for the entire chip will be described later.

As noted, in standby cycle or operation cycle, once notified by means of refresh timing signal RFTM of the need to perform a refresh operation, a refresh request signal RFREQ0 is generated in sync with clock signal ICLK (i.e., in sync with external clock signal CLK), in response to which a refresh operation is initiated.

Figure 8:
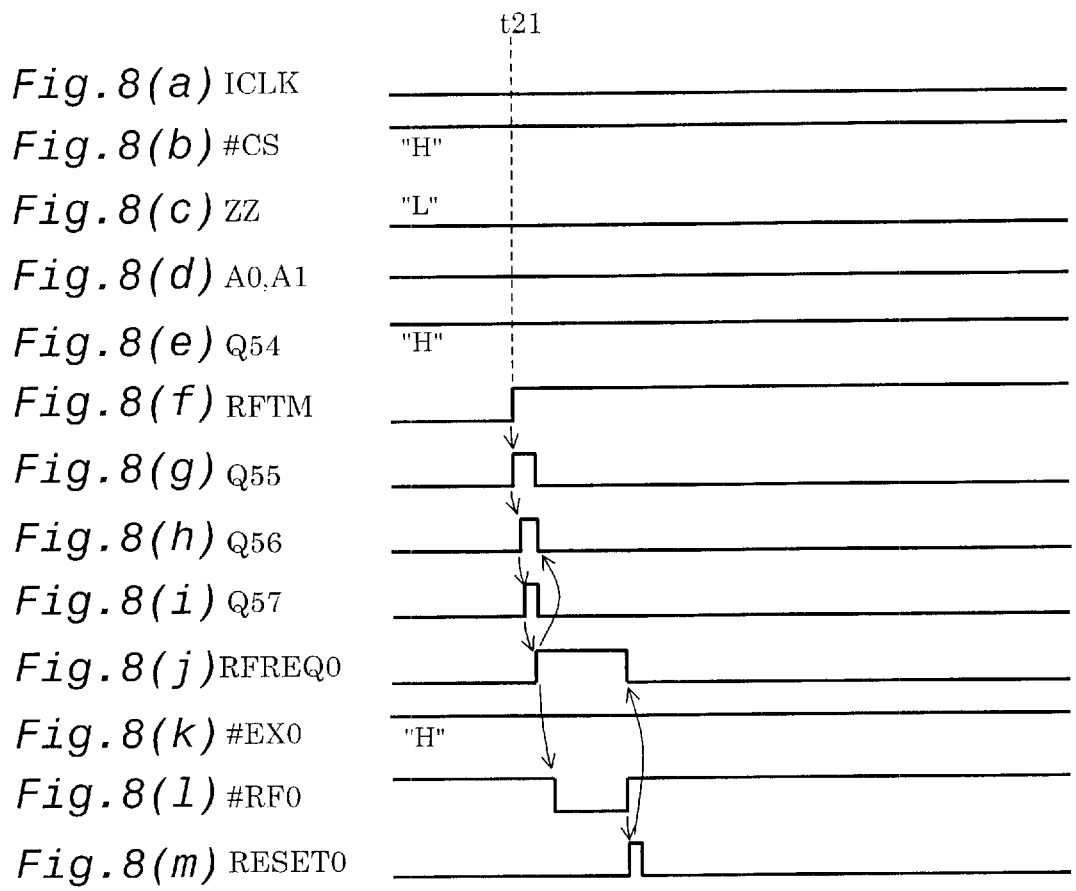
FIGS. 8(a)–8(m) are timing charts showing initiation of a refresh operation in snooze mode.

FIGS. 8(*a*)–8(*m*) are timing charts showing initiation of a refresh operation in snooze mode. In snooze mode, snooze signal ZZ is held at L level so the output Q54 of NAND gate 54 is held at H level (FIG. 8(*e*)). Refresh timing signal RFTM (FIG. 8(*f*)) rises at time t21, and in response the output Q56 (FIG. 8(*h*)) of first latch 56 also rises, whereupon the output Q57 (FIG. 8(*i*)) of AND gate 57 rises to H level. The output of the second latch 58, i.e., refresh request signal RFREQ0 (FIG. 8(*j*)) also rises to H level in response thereto. Since external access is not performed in snooze mode, refresh signal #RF0 always goes to L level (active) when refresh request signal RFREQ0 goes to H level, and the refresh operation is initiated immediately. Operation subsequent to this point in time are the same as in FIGS. 6(*a*)–6(*m*).

As noted, in snooze mode, once notified by means of refresh timing signal RFTM of the need to perform a refresh operation, a refresh operation is initiated immediately on the four blocks 20A–20D. Thus, in snooze mode refresh operations are enabled solely by means of circuits within memory chip 200, without the need for the external clock signal CLK or internal clock signal ICLK.

Figure 9:
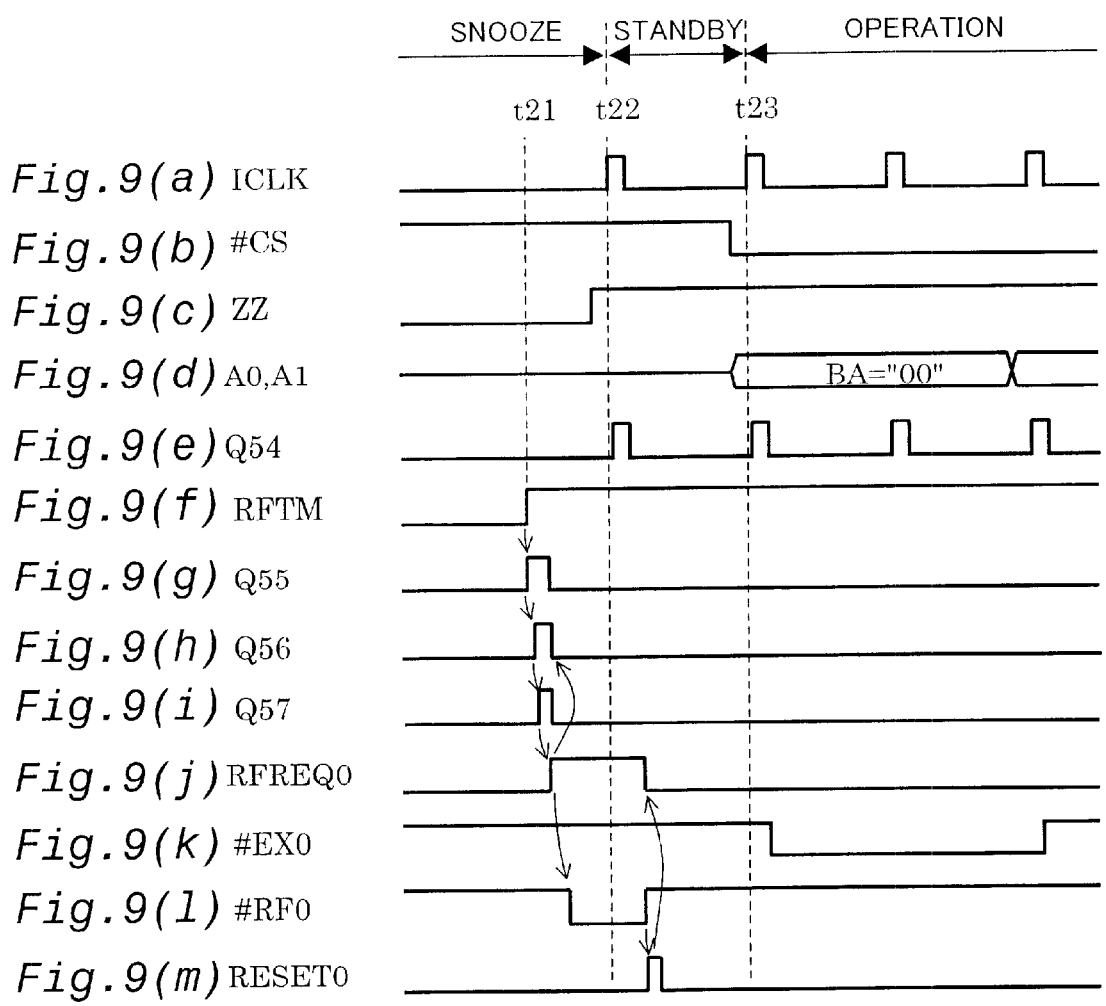
FIGS. 9(a)–9(m) are timing charts of operations during a transition from snooze mode to the operation cycle.

FIGS. 9(*a*)–9(*m*) are timing charts of operations during a transition from snooze mode to the operation cycle. At time t21 in FIGS. 9(*a*)–9(*m*), a refresh operation has been initiated in snooze mode. During initiation of the refresh operation behavior of the signals (FIGS. 9(*e*)–(*m*)) is the same as in FIGS. 8(*a*)–8(*m*).

Assuming that an operation cycle is initiated just at the point in time at which a refresh operation were initiated in snooze mode (time t22 in FIG. 9), the refresh operation and external access would conflict during the initial cycle. As a result, external access (i.e. reading or writing of data) would not be enabled during the operation cycle beginning at time t22. For example, if the refresh operation were performed starting at time t22, there would exist a possibility that data could not be read from the memory cell array 20, or that the external device would read the wrong data from I/O data terminals IO0–IO15.

Accordingly, in this first embodiment when switching from snooze mode to operation cycle, the operation cycle commences after one initial standby cycle, as shown in FIGS. 9(*a*)–9(*m*). This enables correct external access during the operation cycle (the cycle coming after time t23) even in the event that a refresh operation is initiated prior to termination of snooze mode.

Typically, external devices cannot recognize whether an internal refresh operation has been initiated just before termination of snooze mode. Accordingly, when switching from snooze mode to operation cycle, preferred practice is to always generate an input signal from the external device, so that the operation cycle commences after one initial standby cycle has been performed.

The one cycle interposed at during initial switchover from snooze mode to operation cycle is not limited to a standby cycle; any arbitrary cycle that disables external access (hereinafter termed a "nonoperation cycle") may be used. Prior to the operation cycle the nonoperation cycle may be performed at least once in sync with clock signal ICLK or CLK, or may be performed over two or more cycles. From the standpoint of processing speed, however, a single cycle is generally preferred.

Figure 10:
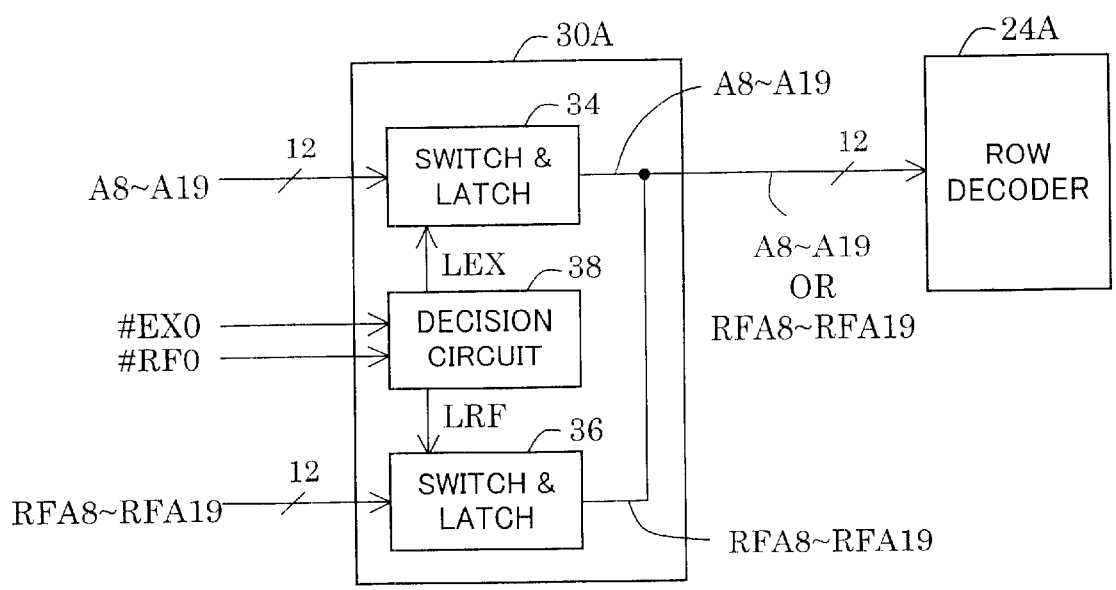
FIG. 10 is a block diagram of the internal configuration of row decoder 30A.

FIG. 10 is a block diagram of the internal configuration of row decoder 30A. Row decoder 30A comprises two switch & latch circuits 34, 36 and a decision circuit 38. The other row decoders 30B–30D have the same arrangement.

Decision circuit 38 has as inputs the refresh signal #RF0 and the external access signal #EX0 supplied by block controller 40A. When external access signal #EX0 is active (L level) the decision circuit 38 sets the latch signal LEX supplied to first switch & latch circuit 34 to active. In response to this latch signal LEX the first switch & latch circuit 34 latches the row address A8–A19 input from the external device and supplies it to row decoder 24A. At this time the latch signal LRF supplied to the second switch & latch circuit 36 is set to inactive, preventing output from the second switch & latch circuit 36.

On the other hand, when the refresh signal #RF0 is active (L level), decision circuit 38 sets the latch signal LRF supplied to the second switch & latch circuit 36 to active. In response to this latch signal LRF the second switch & latch circuit 36 latches the refresh address RFA8–RFA19 and supplies it to row decoder 24A. At this time the latch signal LEX supplied to the first switch & latch circuit 34 is set to inactive, preventing output from the first switch & latch circuit 34.

Block controller 40A (FIG. 5) is configured such that the external access signal #EX0 and refresh signal #RF0 for the same given block 20A are never active at the same time. When both the external access signal #EX0 and refresh signal #RF0 are inactive, row predecoder 30A does not supply an address to row decoder 24A.

In this way, in response to the levels of the external access signal #EX0 and refresh signal #RF0, row predecoder 30A selects and supplies either a row address A8–A19 supplied by an external device, or a refresh address RFA8–RFA19. Thus, when there is a request for external access to block 20A, one word line in block 20A is activated in response to row address A8–A19. When, on the other hand, there is no request for external access to block 20A and a refresh operation is requested, the refresh operation is performed on a plurality of memory cells on one word line in block 20A in response to refresh address RFA8–RFA19.

The operations depicted in FIGS. 6(*a*)–6(*m*), 7(*a*)–7(*m*), 8(*a*)–8(*m*), and 9(*a*)–9(*m*) are carried out analogously for the other blocks 20B–20D. However, external access is performed only for the one block indicated by block address A0–A1; in no event are two or more blocks externally accessed simultaneously. As will be apparent from the following description, however, refresh operations may be performed simultaneously on all four blocks 20A–20D.

A4: Whole Chip Refresh Operation

Figure 11:
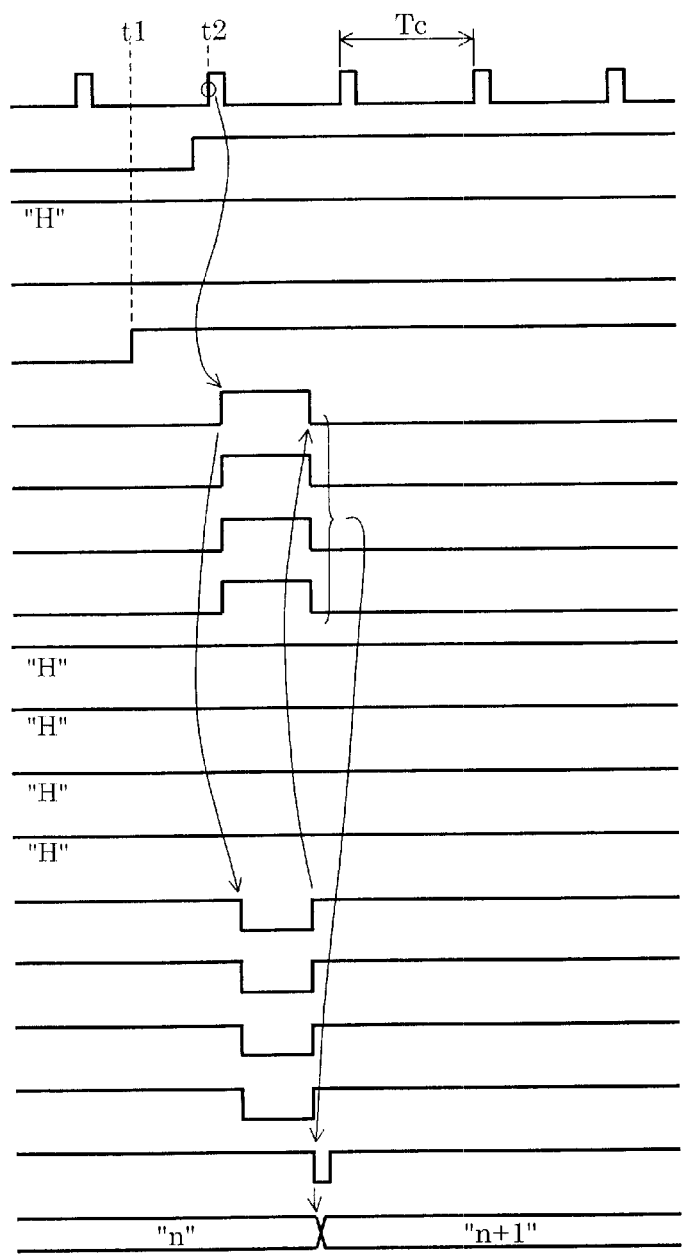
FIGS. 11(a)–11(t) are timing charts showing an overall chip refresh operation in the standby cycle.

FIGS. 11(*a*)–11(*t*) are timing charts showing an overall chip refresh operation in the standby cycle. As noted with regard to FIGS. 6(*a*)–6(*m*), when the refresh timing signal RFTM (FIG. 11(*e*)) rises at time t1, the refresh request signal RFREQ0 for block 20A rises to H level in sync with the next rising edge (time t2) of the clock signal ICLK (FIG. 11(*a*)). Refresh request signals RFREQ1–RFREQ3 for the other blocks 20B–20D also rise to H level at this same time. Since external access is not enabled in the standby cycle, the external access signals #EX0–#EX3 for the four blocks 20A–20D are held at H level (inactive) and the refresh signals #RF0–3 are set to L level (active). As a result, in all four blocks 20A–20D, all memory cells on the nth word line indicated by the same given refresh address RFA8–RFA19 (FIG. 11(*t*)) are refreshed. A single refresh operation is completed within one clock cycle Tc (i.e., one memory cycle time).

When the refresh operation in the four blocks 20A–20D is completed, the four refresh request signals RFREQ1–RFREQ3 (FIGS. 11(*f*)–(*i*)) return to L level. In response to the change in level of refresh request signals RFREQ1–RFREQ3 the refresh counter controller 90 (FIG. 4) generates a countup signal #CNTUP (FIG. 11(*s*)).

Figure 12:
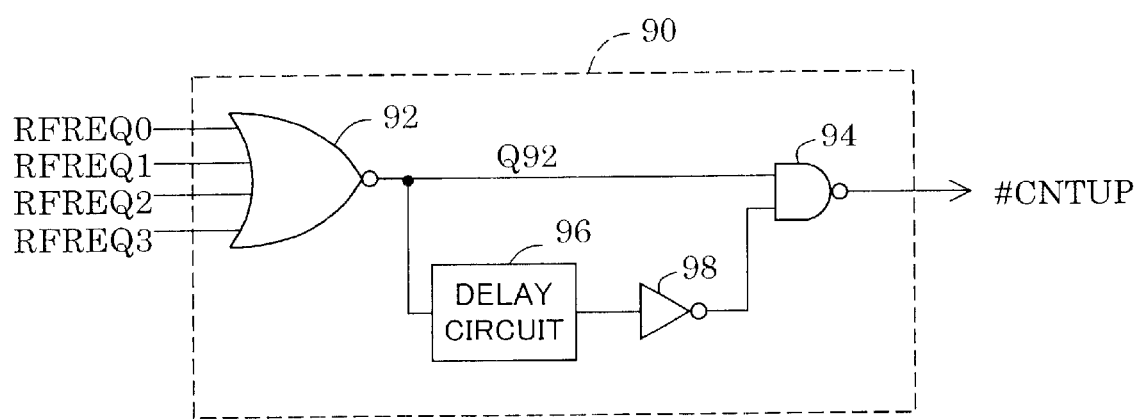
FIG. 12 is a block diagram of the internal configuration of refresh counter controller 90.

FIG. 12 is a block diagram of the internal configuration of refresh counter controller 90. Refresh counter controller 90 comprises a 4-input NOR gate 92, a NAND gate 94, a delay circuit 96, and an inverter 98. The 4-input NOR gate 92 has as inputs the four refresh request signals RFREQ1–RFREQ3. The output Q92 of the 4-input NOR gate 92 is input to one of the input terminals of the NAND gate 94. Output Q92 is also input to the other terminal of the NAND gate 94, after being delayed by the delay circuit 96 and inverted by the inverter 98. As will be apparent from this arrangement, the countup signal #CNTUP output from NAND gate 94 is a pulse signal (FIG. 11(*s*)) that goes to L level after the four refresh request signals RFREQ1–RFREQ3 drop to L level, and kept at L level during a delay interval of delay circuit 96.

In response to countup signal #CNTUP refresh counter 100 increments by 1 the refresh address RFA8–RFA19 (FIG. 11(*t*)). Accordingly, the next refresh operation is performed on the (n+1)th word line.

Since blocks 20A–20D are not externally accessed in the standby cycle, refresh operations may be performed simultaneously on all four blocks 20A–20D.

Figure 13:
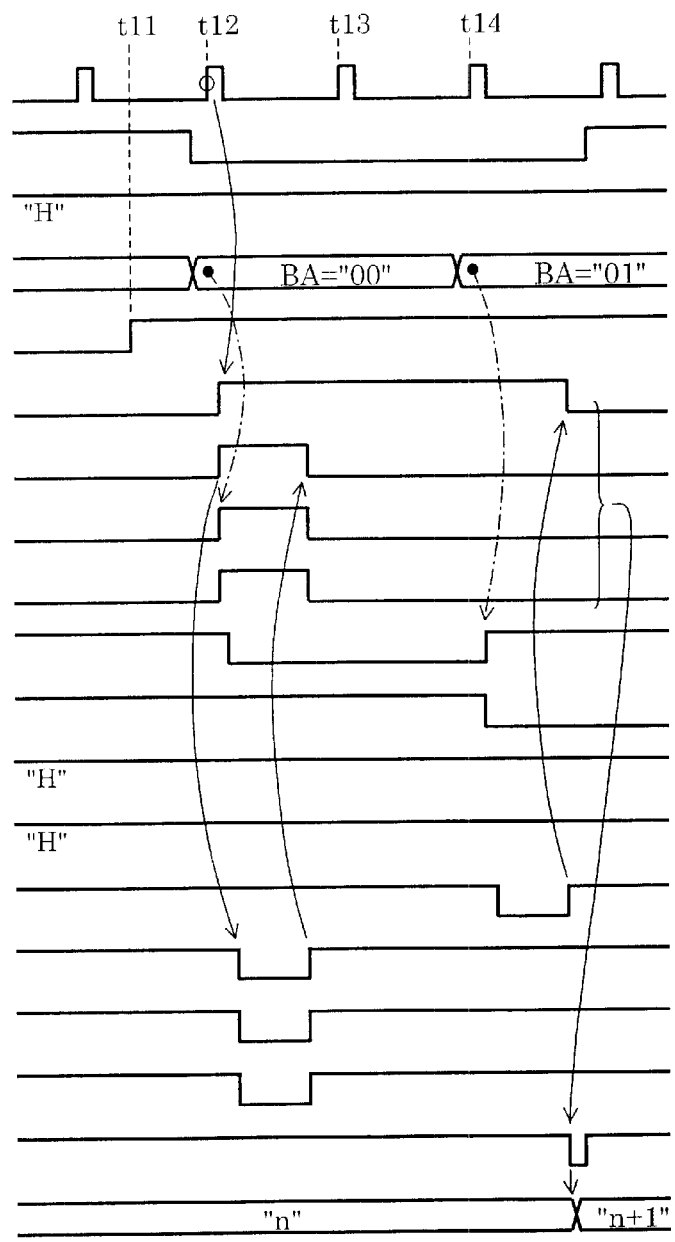
FIGS. 13(a)–13(t) are timing charts of a whole chip refresh operation during the operation cycle.

FIGS. 13(*a*)–13(*t*) are timing charts of a whole chip refresh operation during the operation cycle. As noted with regard to FIGS. 7(*a*)–7(*m*), when the refresh timing signal RFTM (FIG. 13(*e*)) rises at time t11, the refresh request signal RFREQ0 for block 20A rises to H level in sync with the next rising edge (time t12) of the clock signal ICLK (FIG. 13(*a*)). Refresh request signals RFREQ1–RFREQ3 for the other blocks 20B–20D also rise to H level at this same time. At time t12, the block address A0–A1 value is "00" and there is a request for external access to the first block 20A. Accordingly, external access signal #EX0 (FIG. 13(*k*)) for the first block 20A is set to L level (active), while refresh signal #RF0 is held at H level (inactive). Operation up to this point is analogous to that in FIGS. 7(*a*)–7(*m*).

As regards the other blocks 20B–20D for which external access is not requested at time t12, the external access signals #EX1–#EX3 (FIGS. 13(*l*)–13(*n*)) are held at H level (inactive) and the refresh signals #RF1–#RF3 (FIGS. 13(*p*)–13(*r*)) are set to L level (active). Accordingly, in the cycle beginning at time t12 external access is performed on the first block 20A while refresh operations are performed on the other three blocks 20B–20D. Refresh request signals RFREQ1–RFREQ3 for the other three blocks 20B–20D return to L level upon completion of the refresh operation. The refresh request signal RFREQ0 for block 20A, in which the refresh operation has been postponed, is maintained at H level.

At the time of the next rising edge (time t13) of clock signal ICLK, since external access of the first block 20A is ongoing, block 20A is not refreshed. Accordingly, refresh request signal RFREQ0 is maintained at H level.

At the time of the next rising edge (time t14) of clock signal ICLK, block address A0–A1 changes to one indicating external access to second block 20B. External access signal generating circuit 42 now sets the external access signal #EX0 (FIG. 13(*k*)) for the first block 20A to H level (inactive) and sets the refresh signal #RF0 (FIG. 13(*o*)) to L level (active) so that a refresh operation is performed. Thus, in the cycle subsequent to time t14 only the first block 20A is refreshed. Upon completion of the refresh operation the refresh request signal RFREQ0 returns to L level.

When refresh operations in all four blocks 20A–20D are completed and the four refresh request signals RFREQ0–RFREQ3 return to L level, a countup signal #CNTUP (FIG. 13(*s*)) is generated and the refresh address RFA8–RFA19 (FIG. 13(*t*)) is incremented by 1.

Let it now be assumed that an external access of a given block 20A continues for more than one refresh period (one period of refresh timing signal RFTM). In this instance the next refresh timing will occur prior to refresh address RFA8–RFA19 being incremented. In this event the refresh operation for the nth word line will be repeated again for the four blocks 20A–20D by the procedure shown in FIGS. 13(a)–13(t). That is, since the refresh address is incremented only after refresh operations for a given refresh address have been completed for all blocks, all word lines in the four blocks 20A–20D will be refreshed in a reliable manner.

When a refresh operation is requested in the operation cycle, the refresh operation is delayed only for that block for which external access has been requested, with refresh operations being performed in the usual manner on the remaining three blocks. When external access of block for which external access has been requested is completed, a refresh operation is performed on that block. This procedure offers the following advantages.

A first advantage is that refresh transparency is ensured. As used herein, "refresh transparency" refers to a lack of delay of external access by the internal refresh operation, as perceived by an external device. That is, in the operation cycle the decision to execute external access or a refresh operation for each block is made in sync with the clock signal ICLK (i.e., in sync with the external clock signal CLK). The refresh operation is completed within one cycle Tc. Accordingly, when external access is requested the external access may always be performed promptly without delay.

A second advantage is that in the event of prolonged external access to memory chip 200, refresh operations may nonetheless be performed on all blocks provided that the block being externally accessed during this time changes. This second advantage has the effect of further enhancing refresh transparency. This advantage do not require dividing the memory array 20 into four blocks; it is sufficient to divide it into at least two blocks. However, blocks for external access should be switched frequently. This may be achieved by assigning a 2-bit block address A0–A1 that changes frequently. Typically, in a multiple-bit address it tends to be easier to change the lower bits. Accordingly, when assigning addresses identifying a plurality of blocks in a memory array it is typically preferable to assign to the block address the lowest bits of the multiple-bit address.

Figure 14:
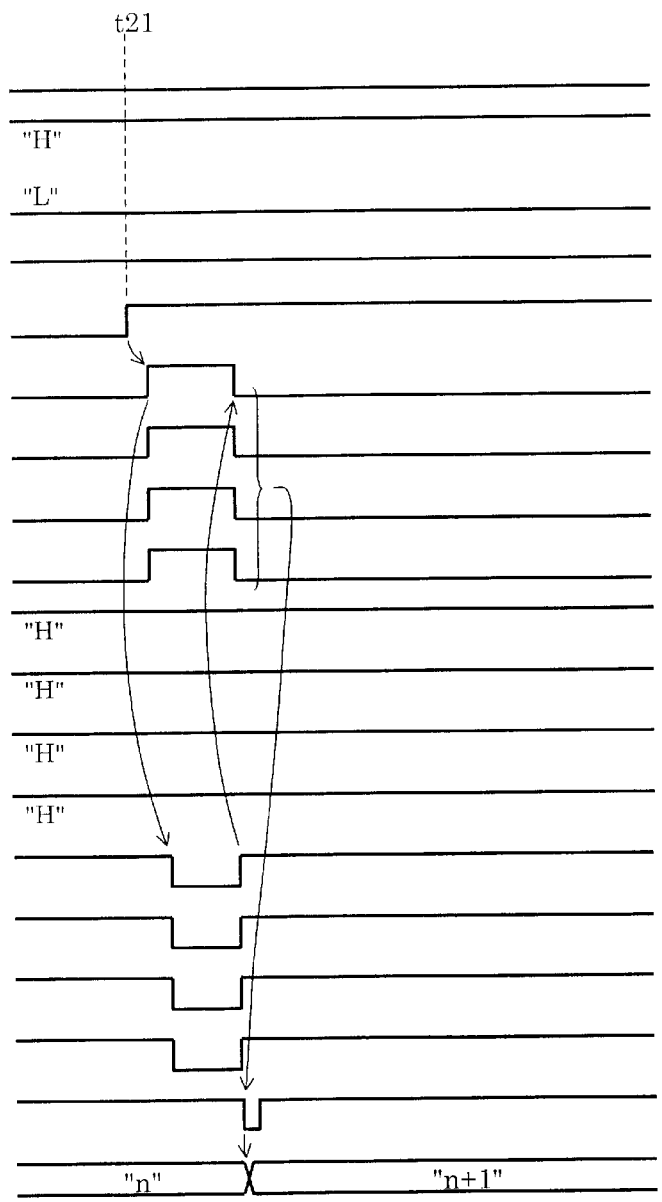
FIGS. 14(a)–14(t) are timing charts of the refresh operation for the whole chip in snooze mode.

FIGS. 14(a)–14(t) are timing charts of the refresh operation for the whole chip in snooze mode. As noted with regard to FIGS. 8(a)–8(m), when the refresh timing signal RFTM (FIG. 14(e)) rises at time t21, the refresh request signals RFREQ0–RFREQ3 for blocks 20A–20D immediately rise to H level. Since external access is not performed in snooze mode, external access signals #EX0–#EX3 for the four blocks 20A–20D are maintained at H level (inactive), and refresh signals #RF0–#RF3 drop to L level (active). As a result, memory cells on a given nth word line in blocks 20A–20D are refreshed. Subsequent operation is analogous to that in the standby cycle shown in FIGS. 11(a)–11(t).

Thus, in snooze mode the timing for initiating refresh operations is not synchronized with the clock signal ICLK; rather, the four blocks 20A–20D are refreshed simultaneously as soon as a refresh operation initiation time is indicated by the refresh timing signal RFTM.

As set forth hereinabove, in operating mode the memory chip 200 of Embodiment 1 simultaneously decides external access requests and internal refresh operation requests in sync with the clock signal CLK so there is no delay in external access. In snooze mode, when there is a refresh operation request by the refresh timing signal RFTM, all blocks 20A–20D are refreshed, enabling refresh operations to be performed in the absence of a clock signal CLK supplied by an external device.

That is, in Embodiment 1 the operation cycle and snooze mode employ different signals (clock signal ICLK and refresh timing signal RFTM) for deciding the timing for initiating refresh operations, allowing refresh operations to be performed in a manner suitable for each mode. Specifically, in the operating cycle refresh operations are performed in a manner that ensures refresh transparency, while in snooze mode refresh operations are performed in a low power consumption operating mode that does not employ clock signal ICLK.

During the transition from snooze mode to the operation cycle, a single standby cycle is interposed prior to the operation cycle so that in the event that a refresh operation has been initiated just prior to transitioning to the operation cycle, the refresh operation will be completed by the time that the operation cycle starts, preventing conflicts between refresh operations and external accesses.

B. Embodiment 2

Figure 15:
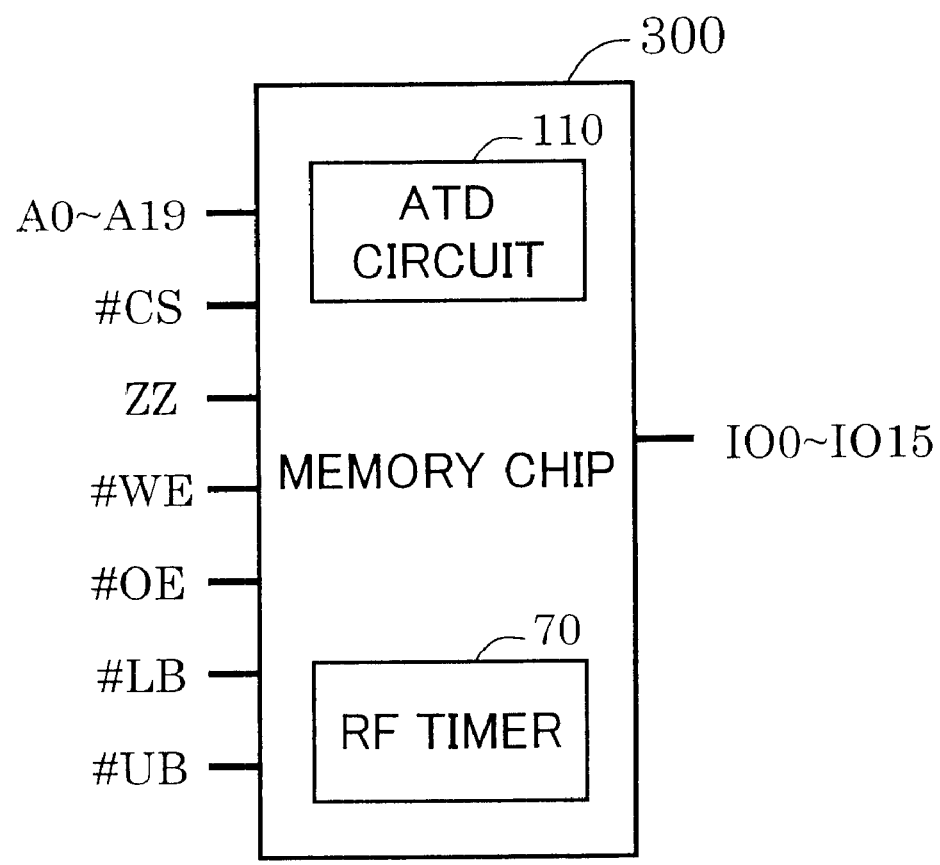
FIG. 15 is a illustrative diagram showing the pinout of a memory chip 300 pertaining to Embodiment 2 of the invention.
Figure 17:
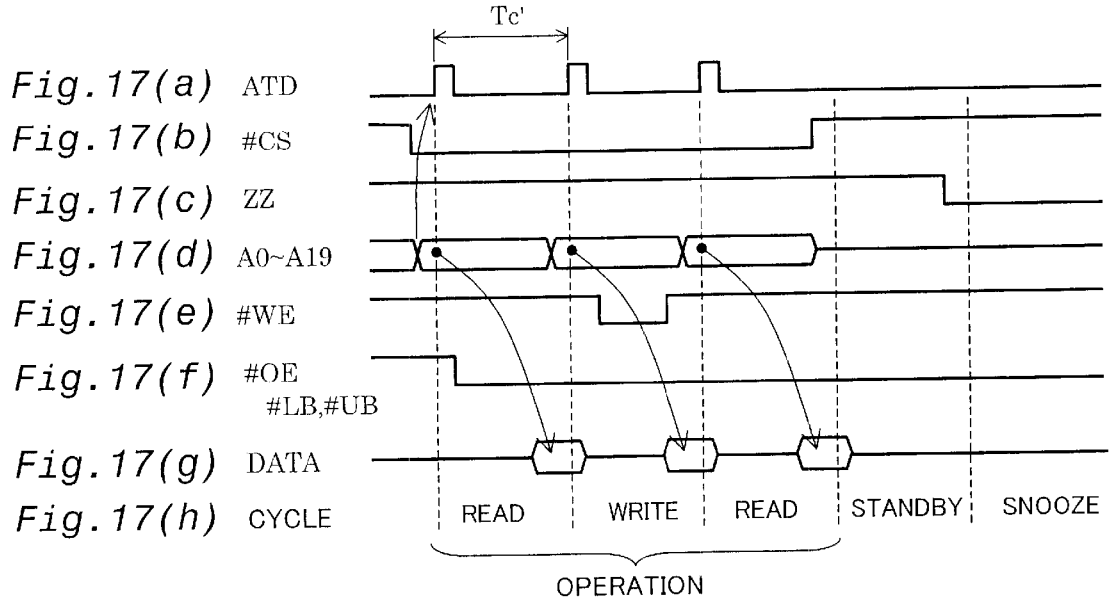
FIGS. 17(a)–17(h) are timing charts summarizing operations of the memory chip 200 of Embodiment 2.

FIG. 15 is an illustrative diagram showing the pinout of a memory chip 300 pertaining to Embodiment 2 of the invention. Memory chip 300 lacks a clock input terminal CLK, a feature thereof being the lack of need for input of an external clock signal CLK. Access to memory chip 300 by external devices (such as a CPU) is possible by a process analogous to that of ordinary asynchronous SRAM.

Within memory chip 300 is provided an address transition detecting circuit (hereinafter referred to as "ATD circuit") 110 for detecting any changes of one bit or more in I/O address A0–A19. As will be described later, an ATD signal generated by the ATD circuit 110 functions in a substantially identical manner to the clock signal ICLK in Embodiment 1.

FIG. 16 shows the different operating states of the memory chip 300 of Embodiment 2. The only point of difference with Embodiment 1 (FIG. 2) is that in first refresh mode 1 the ATD signal is used in place of the clock signal ICLK. That is, in first refresh mode, once the refresh timer 70 has generated a refresh timing signal, the refresh operation is initiated in sync with the ATD signal. In second refresh mode, as in Embodiment 1, a refresh operation is initiated as soon as the refresh timer 70 generates a refresh timing signal.

FIGS. 17(a)–17(h) are timing charts summarizing operations of the memory chip 200 of Embodiment 2. The three operating modes in Embodiment 2 (operation, standby and snooze) are substantially identical to those in Embodiment 1 shown in FIG. 3. However, Embodiment 2 differs from Embodiment 1 in that as a general rule the I/O address A0–A19 does not vary except in the operation cycle. Accordingly, the operating mode (operation, standby or snooze) is determined as needed in response to changes in the chip select signal #CS and snooze signal ZZ.

The cycle period Tc' of the operation cycle of the memory chip 300 of Embodiment 2 (i.e., the shortest period for change in address A0–A19) is somewhat longer that the cycle period Tc of the memory chip 200 of Embodiment 1. The reason will be discussed later.

Figure 18:
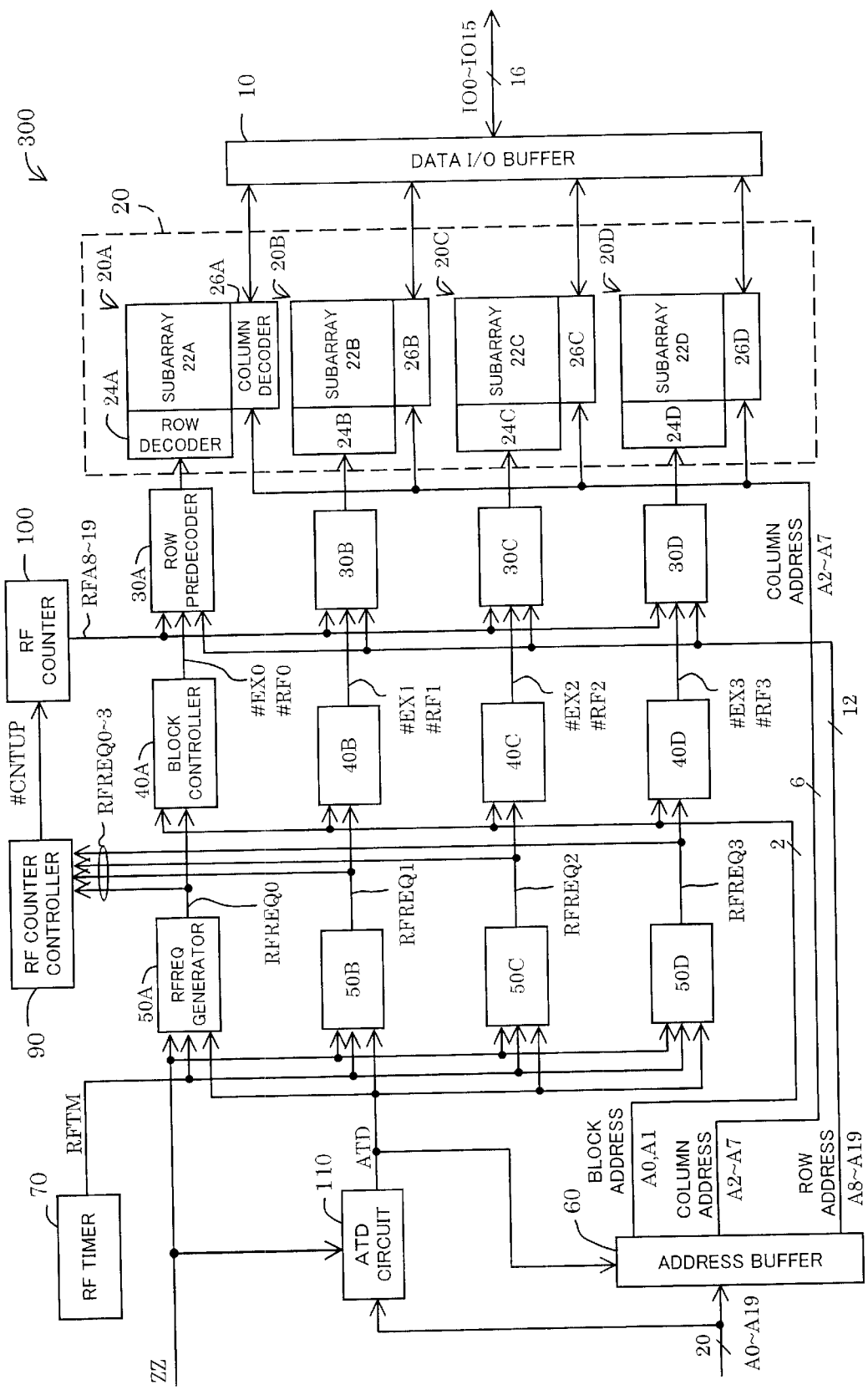
FIG. 18 is a block diagram showing the internal configuration of the memory chip 300 of Embodiment 2.

FIG. 18 is a block diagram showing the internal configuration of the memory chip 300 of Embodiment 2. A point of difference with Embodiment 1 shown in FIG. 4 is that an ATD circuit 110 is provided in place of clock controller 80, but in other aspects is identical to Embodiment 1. ATD circuit 110 detects whether there is any change of one bit or more in an I/O address A0–A19 supplied by an external device; if a change is detected, it generates an ATD signal.

Figure 19:
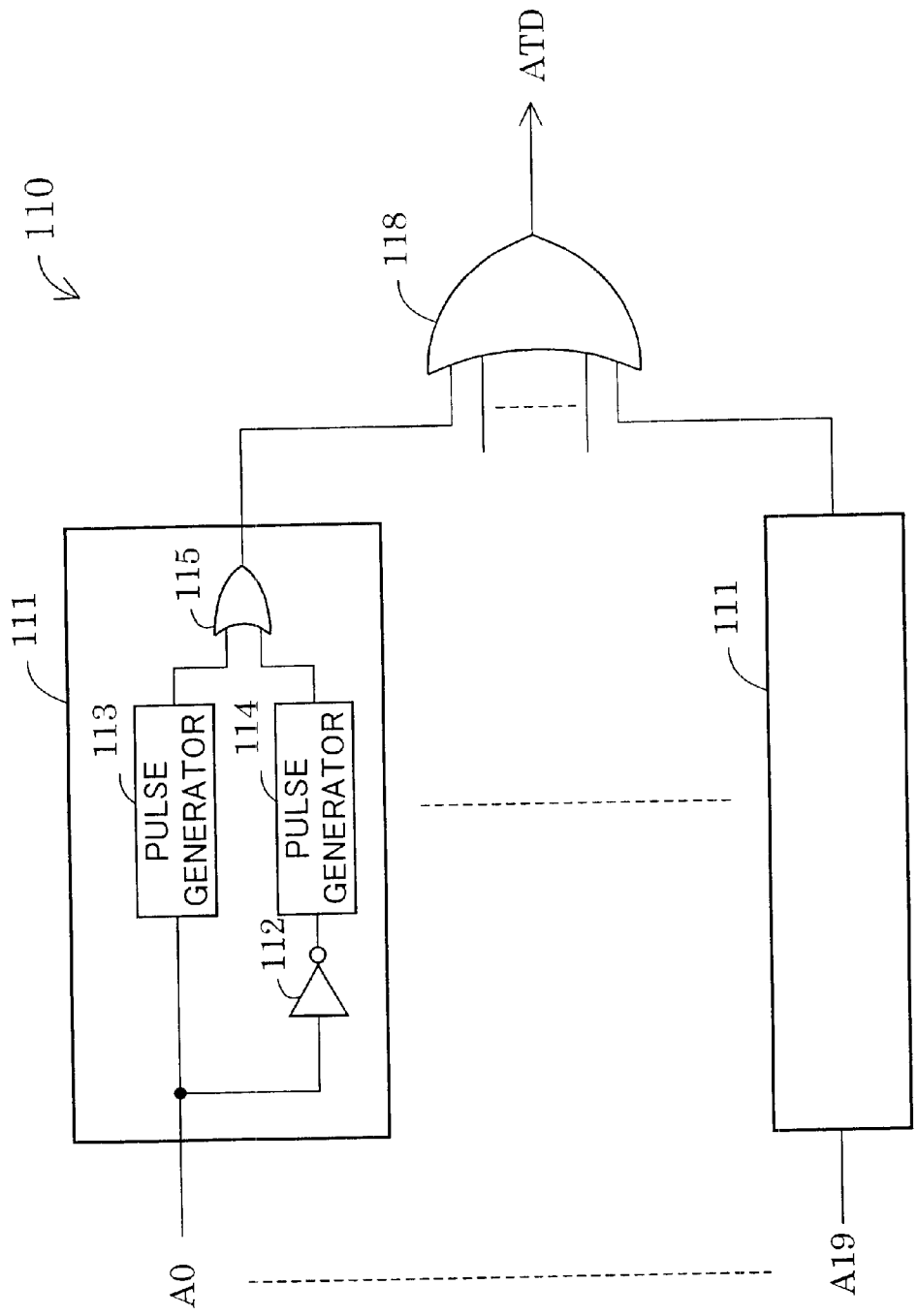
FIG. 19 is a block diagram showing the internal configuration of the ATD circuit 110.

FIG. 19 is a block diagram showing the internal configuration of the ATD circuit 110. ATD circuit 110 comprises 20 transition detection circuits (corresponding to the number of bits of the I/O address A0–A19) 111 and a 20-input OR gate 118. Each transition detection circuit 111 has an inverter 112, two pulse generating circuits 113, 114, and an OR gate 115. One-shot multivibrators may be used for the pulse generating circuits 113, 114.

The first pulse generating circuit 113 generates a single pulse having a predetermined pulse width in response to the rising edge of address bit A0. Inverter 112 and the second pulse generating circuit 114 generate a single pulse having a predetermined pulse width in response to the falling edge of address bit A0. Accordingly, OR gate 115 outputs a single pulse for each of rising and falling edges of address bit A0. The procedure is the same for the other address bits A1–A19.

20-input OR gate 118 has as input the outputs of the 20 transition detection circuits. Thus, if there is any change in level in one or more of the bits of the 20-bit I/O address A0–A19, a pulsed ATD signal is output from the OR gate 118. As shown in FIG. 18, this ATD signal is supplied to an address buffer 60 and refresh request signal generating circuits 50A–50D, and has a function analogous to the clock signal ICLK in Embodiment 1.

Figure 20:
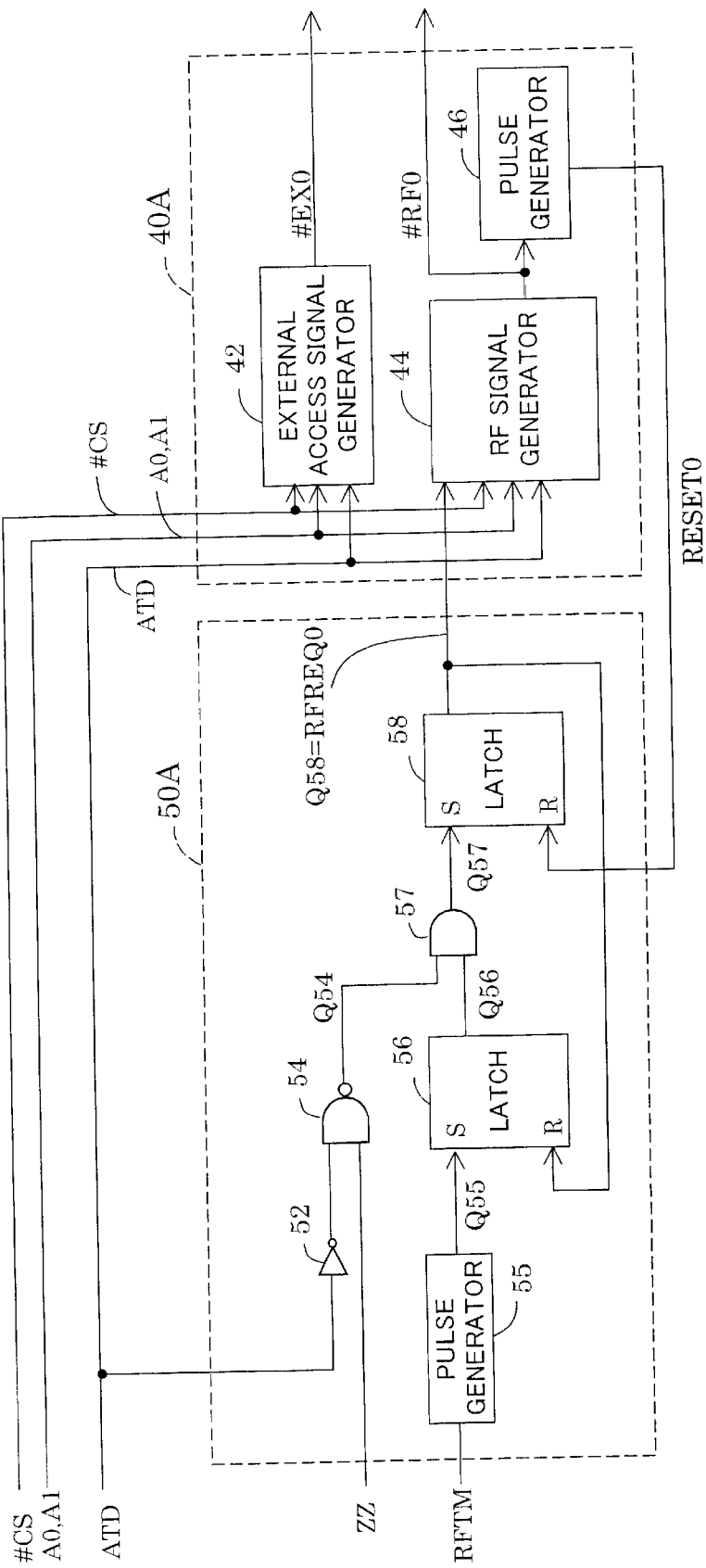
FIG. 20 is a block diagram showing the internal configuration of the refresh request signal generating circuit 50A and block controller 40A in Embodiment 2.

FIG. 20 is a block diagram showing the internal configuration of the refresh request signal generating circuit 50A and block controller 40A in Embodiment 2. The only point of difference with FIG. 5 described in Embodiment 1 is that the ATD signal replaces the clock signal ICLK; in other aspects it is identical to Embodiment 1.

FIGS. 21(a)–21(m) are timing charts showing initiation of a refresh operation in the standby cycle in Embodiment 2. As a general rule, in the memory chip 300 of Embodiment 2 the I/O address A0–A19 does not change during the standby cycle. However, as noted with reference to FIG. 16, the standby cycle employs a first refresh mode wherein refresh operations are synchronized with the ATD signal. An external device therefore periodically changes at least one address bit (A0, for example) during the standby cycle so that internal refresh operations are performed. In preferred practice, the period for the change in the address bit will be no more than one half of the refresh period stipulated by the refresh timing signal RFTM. The reason is that if the address bit changes at an interval equivalent to one half or less of the refresh period, the ATD signal will be generated at least once while the refresh timing signal RFTM is H level.

Figure 21:
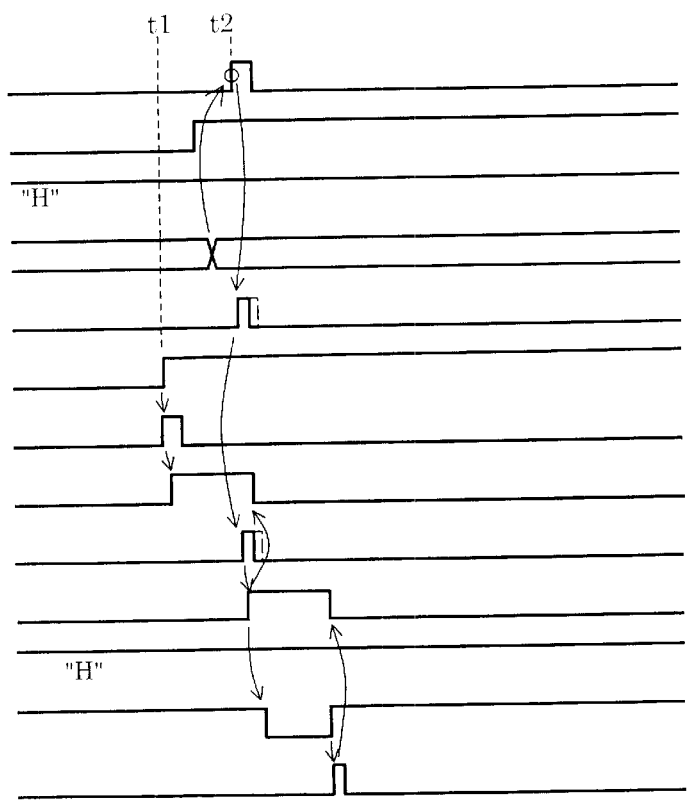
FIGS. 21(a)–21(m) are timing charts showing initiation of a refresh operation in the standby cycle in Embodiment 2.
Figure 22:
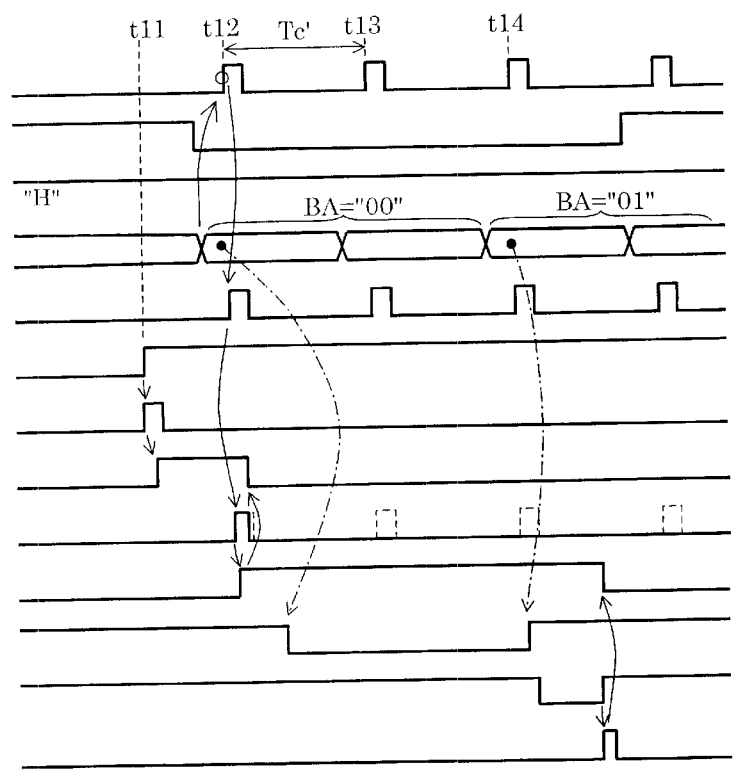
FIGS. 22(a)–22(m) are timing charts showing initiation of a refresh operation in the operation cycle in Embodiment 2.
Figure 23:
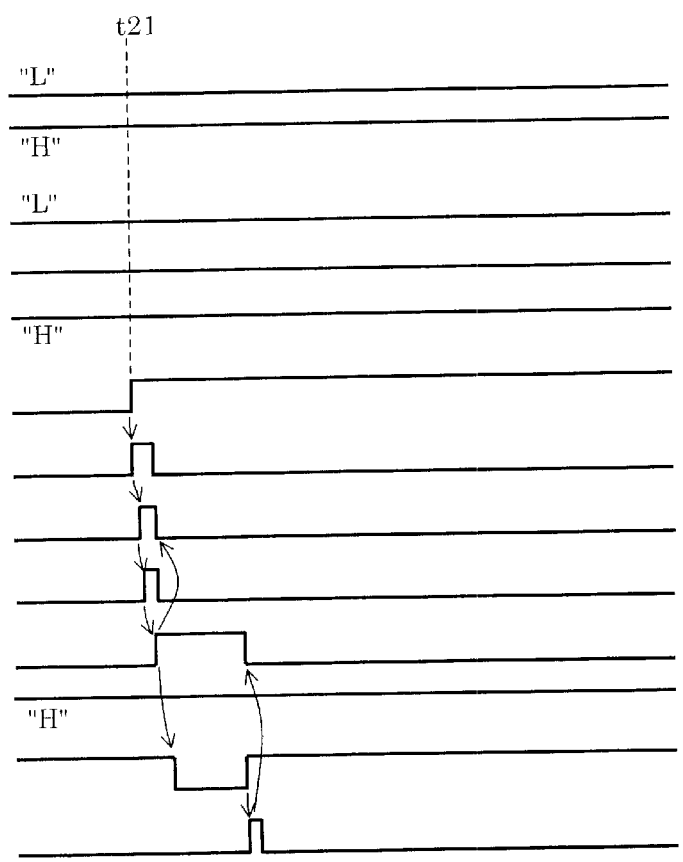
FIGS. 23(a)–23(m) are timing charts showing initiation of a refresh operation in snooze mode in Embodiment 2.

At time t1 in FIGS. 21(a)–21(m) the refresh timing signal RFTM (FIG. 21(f)) rises to H level, and at time t2, in response to a change in address A0–A19 (FIG. 21(d)), an ATD signal is generated (FIG. 21(a)). Subsequent operation is analogous to that in Embodiment 1 depicted in FIGS. 6(a)–6(m).

FIGS. 22(a)–22(m) are timing charts showing initiation of a refresh operation in the operation cycle in Embodiment 2. In the operation cycle, address A0–A19 changes at each cycle Tc' so refresh operations are analogous to those in Embodiment 1.

FIGS. 23(a)–23(m) are timing charts showing initiation of a refresh operation in snooze mode in Embodiment 2. In Embodiment 2. as in Embodiment 1, with the system in snooze mode, once notified by means of refresh timing signal RFTM of the timing for a refresh operation, a refresh operation is initiated immediately. Thus, in snooze mode refresh operations are enabled solely by means of internal circuits within memory chip 200, without the need for a change in the address A0–A19 input from the external device.

From the preceding description it will be apparent that in Embodiment 2, address A0–A19 acts as the "external timing signal used together with a refresh timing signal when determining the timing for performing refresh operations" in the present invention.

Figure 24:
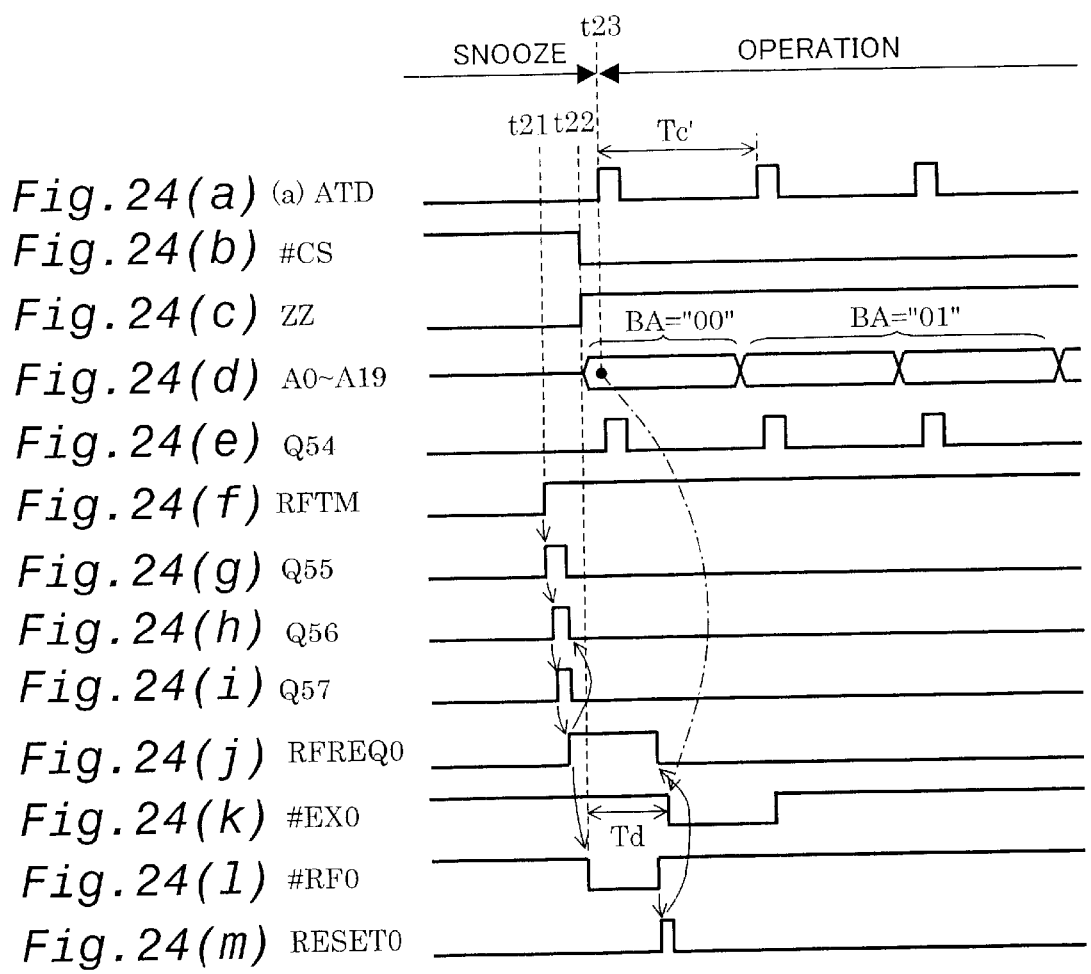
FIGS. 24(a)–24(m) are timing charts of operations during a transition from snooze mode to the operation cycle in Embodiment 2.

FIGS. 24(a)–24(m) are timing charts of operations during a transition from snooze mode to the operation cycle in Embodiment 2. At time t21, a refresh operation has been initiated in snooze mode. During initiation of the refresh operation behavior of the signals (FIGS. 24(e)–24(m)) is the same as in FIGS. 23(e)–23(m). At time t22 refresh signal #RF0 (FIG. 24(l)) is set to L level (active), in response to which a refresh operation on the first block 20A is initiated.

In the example of FIGS. 24(a)–24(m), chip select signal #CS and snooze signal ZZ change at time t22, and the operation cycle begins. Since a refresh operation has already been initiated, external access is performed only after the refresh operation is finished. Specifically, external access signal #EX0 (FIG. 24(k)) goes to L level (active) after a delay Td from the time t22 that the operation cycle begins.

The timing for the external access signal #EX0 in the operation cycle is set so as to be optimized by default for situations like that in FIGS. 24(a)–24(m). Specifically, in the operation cycle the external access signal #EX0 level is set such that external access is initiated after a predetermined delay Td from the time that the operation cycle begins (specifically, the time at which the chip select signal #CS goes from H level to L level). The external access signals #EX1–#X3 for the other blocks behave the same way.

In preferred practice, the cycle Tc' of the memory chip 300 of Embodiment 2 will be of sufficient duration that external access can be completed within one cycle Tc', even in a situation like that in FIGS. 24(a)–24(m). That is, the duration of cycle Tc' will preferably be set such that external access can be completed in one operation cycle even in the event that an internal refresh operation is initiated just at the point in time at which the operation cycle begins. By so doing, external access can be completed within one cycle Tc', even in a situation like that in FIGS. 24(a)–24(m), obviating the need for external devices to be aware of internal refresh operations and allowing them to access the memory chip 300 at any time.

This Enhances Refresh Transparency

As noted with reference to FIGS. 9(a)–9(m), in the preceding Embodiment 1, insertion of a single standby cycle during the transition from snooze mode to the operation cycle prevents conflicts between internal refresh and external access operations. The reason that this is possible is that operation cycle and standby cycle are synchronized with the external clock signal CLK.

In Embodiment 2 on the other hand, the external clock signal CLK is not used, so it is not always an easy matter to insert a standby cycle as in FIGS. 9(a)–9(m). Thus, in Embodiment 2, the cycle period Tc' is set to sufficient duration so as to avoid conflicts between internal refresh and external access operations even in a worst-case scenario.

Thus, the cycle period Tc' in the memory chip 300 of Embodiment 2 will be longer than the cycle period Tc in the memory chip 200 of Embodiment 1, and so from an operational standpoint the memory chip 200 of Embodiment 1 is preferred. However, the memory chip 300 of Embodiment 2 obviates the need for external clock signal CLK input, and the external device access procedure is similar to that of ordinary asynchronous SRAM, making it easier to use than the memory chip 200 of Embodiment 1.

The whole chip refresh operation in Embodiment 2 is substantially identical to that in Embodiment 1, making further description unnecessary.

As noted hereinabove, in memory chips 200, 300 of Embodiments 1 and 2, in first refresh mode internal refresh operations are performed after a refresh timing signal RFTM has been issued, and according to a timing determined by a clock signal CLK or address A0–A19 supplied by an external device. In second refresh mode, internal refresh operations are performed immediately upon generation of a refresh timing signal RFTM. Thus, internal refresh operations in memory chips 200, 300 are performed in a manner suitable for each operating mode.

C. Application in an Electronic Device

Figure 25:
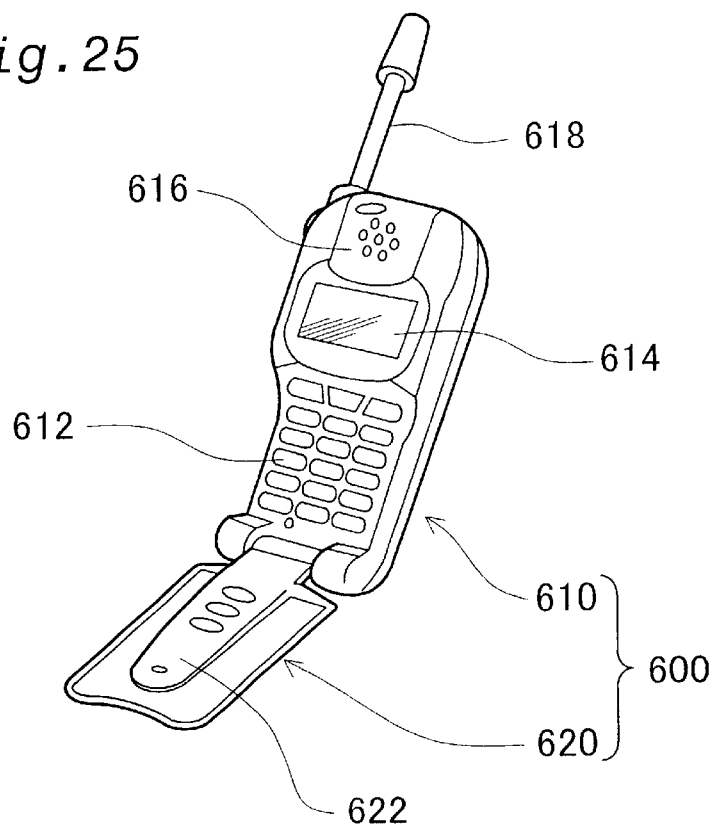
FIG. 25 is a perspective view of a mobile phone as an exemplary electronic device embodying the semiconductor memory device of the invention.

FIG. 25 is a perspective view of a mobile phone by way of an exemplary electronic device embodying the semiconductor memory device herein. Mobile phone 600 comprises a body 610 and a cover 620. Body 610 is provided with a keyboard 612, a liquid crystal display 614, a speaker 616, and an antenna 618. Cover 620 is provided with a microphone 622.

Figure 26:
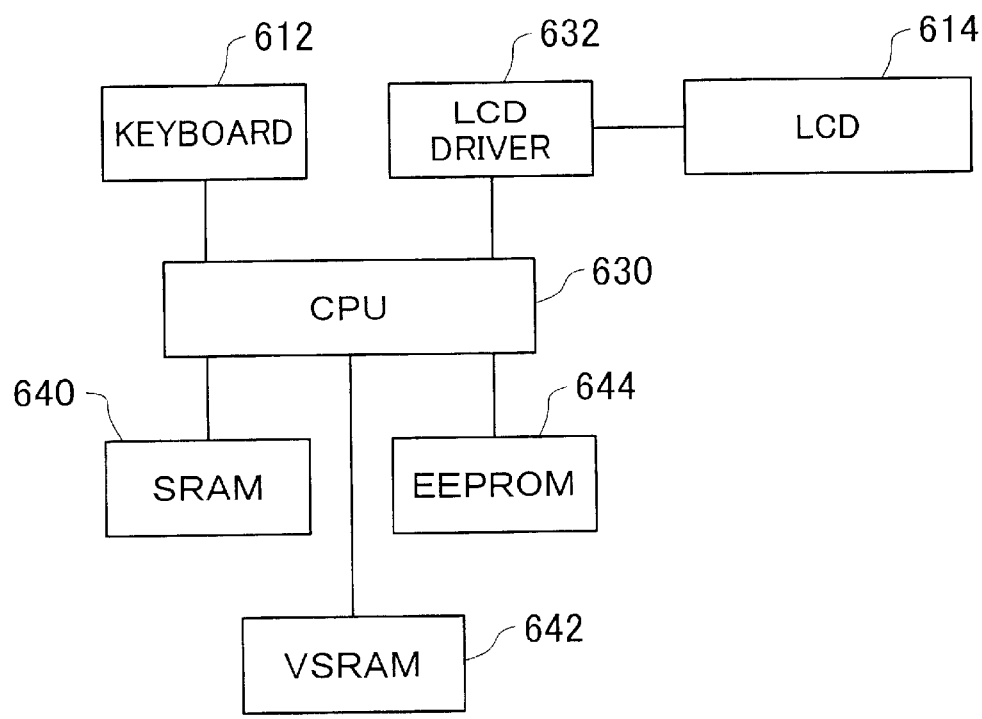
FIG. 26 is a block diagram of the electronics of mobile phone 600.

FIG. 26 is a block diagram of the electronics of mobile phone 600. CPU 630 is connected via a bus line (not shown) to keyboard 612, an LCD driver 632 for driving liquid crystal display 614, a SRAM 640, a VSRAM 642, and an EEPROM 644.

SRAM 640 is used as a high speed cache memory, for example. VSRAM 642 is used as a working memory for image processing, for example. The memory chip 200 of Embodiment 1 or the memory chip 300 of Embodiment 2 may be used for VSRAM 642 (referred to as virtual SRAM or pseudo SRAM). EEPROM 644 contains various settings for the mobile phone 600.

When operation of mobile phone 600 is temporarily suspended, VSRAM 642 may be maintained in snooze mode. By so doing, internal refresh operations in VSRAM 642 will be performed automatically, enabling data in VSRAM 642 to be preserved. As the memory chips 200, 300 of the Embodiments have relatively large capacity, a further advantage is that large amounts of data—such as video data—can be held for extended periods.

D. Modifications

D1. Modification 1

In the preceding embodiments, refresh operations are performed according to a first refresh mode in the standby cycle; however, refresh operations may be performed according to a second refresh mode in the standby cycle. Alternatively, refresh operations may be performed according to yet another refresh mode different from the first and second refresh modes in the standby cycle.

D2. Modification 2

In the first refresh mode, refresh operations are initiated after the rising edge of refresh timing signal RFTM, and in sync with the external clock signal CLK (in Embodiment 1) or after the rising edge of refresh timing signal RFTM, and in sync with an ATD signal (i.e. a change in address A0–A19) (in Embodiment 2). However, a signal other than the external clock signal CLK or ATD signal may be used as the signal for determining the timing at which refresh operations will be initiated in the first refresh mode (termed an "external timing signal"). In general, in the first refresh mode, refresh operations may be initiated according to a timing determined by an external timing signal supplied by an external device.

D3. Modification 3

In the preceding embodiments, in second refresh mode, a refresh operation is initiated immediately upon generation of a refresh timing signal RFTM. However, an arrangement whereby a refresh operation is initiated after a predetermined time interval has elapsed after generation of the refresh timing signal RFTM is also possible. In second refresh mode it is sufficient for a refresh operation to be initiated in response to generation of a refresh timing signal RFTM, regardless of whether an external timing signal is present.

Although the present invention has been described and illustrated in detail, it is clearly understood that the same is by way of illustration and embodiment only and is not to be taken by way of limitation, the spirit and scope of the present invention being limited only by the terms of the appended claims.

What is claimed is:

1. A semiconductor memory device having a plurality of operating modes, comprising:

a memory cell array having dynamic memory cells;

a refresh controller having a refresh timer for generating a refresh timing signal used to determine timing for performing refresh operations on the memory cell array, the refresh controller performing refresh operations on the memory cell array in response at least to the refresh timing signal;

an operating mode input terminal for receiving from an external device an operating mode signal specifying one of the plurality of operating modes of the semiconductor memory device; and an external timing input terminal for receiving from the external device an external timing signal that is to be used together with the refresh timing signal when the refresh controller determines the timing for performing the refresh operations; wherein (i) in an event that the operating mode signal specifies a first operating mode of the plurality of operating modes the refresh controller performs a refresh operation according to a first refresh mode wherein the refresh operation in the first refresh mode on the memory cell array is initiated under timing determined by the external timing signal after the refresh timing signal has been generated;

(ii) in an event that the operating mode signal specifies a second operating mode of the plurality of operating modes, the refresh controller performs a refresh operation according to a second refresh mode wherein the refresh operation in the second refresh mode on the memory cell array is initiated in response to generation of the refresh timing signal, regardless of the external timing signal;

(iii) the memory cell array is divided into a plurality of blocks; and (iv) when the refresh operation in the first refresh mode is initiated and data is being read from or written to one block from among the plurality of blocks, the refresh controller performs the refresh operation on blocks other than the block from or to which the data is being read or written upon completion of the read or write operation on the block.

2. A semiconductor memory device according to claim 1, wherein the first operating mode includes a read/write cycle wherein at least one of reading and writing of data from and to the semiconductor memory device is enabled; and the second operating mode includes a power saving mode wherein reading and writing of data from and to the semiconductor memory device are disabled, and having lower power consumption than the first operating mode.

3. A semiconductor memory device according to claim 1, wherein the external timing signal is a clock signal;

the semiconductor memory device performs the read/write cycle in sync with the clock signal in the first operating mode; and in the first refresh mode the refresh controller performs the refresh operation on the memory array in sync with the clock signal, after the refresh timing signal has been generated.

4. A semiconductor memory device according to claim 3, further comprising:

a clock controller for controlling the clock signal supplied by the external device;

wherein, when the semiconductor memory device is in the first operating mode, the clock controller supplies the clock signal to predetermined circuits within the semiconductor memory device including the refresh controller, and when the semiconductor memory device is in the second operating mode the clock controller ceases to supply the clock signal to the predetermined circuits.

5. A semiconductor memory device according to claim 4, wherein the second operating mode is a mode with a lowest level of power consumption by the semiconductor memory device.

6. A method for refresh control of a memory cell array in a semiconductor memory device comprising:

a memory array having dynamic memory cells, and a refresh timer for generating a refresh timing signal used to determine the timing for performing refresh operations on the memory cell array, wherein (i) when the semiconductor memory device is in a first operating mode, a refresh operation is performed according to a first refresh mode wherein the refresh operation in the first refresh mode on the memory cell array is initiated under timing determined by the external timing signal, after the refresh timing signal has been generated;

(ii) when the semiconductor memory device is in a second operating mode, a refresh operation is performed according to a second refresh mode wherein the refresh operation in the second refresh mode on the memory cell array is initiated in response to generation of the refresh timing signal, regardless of the external timing signal;

(iii) the memory cell array is divided into a plurality of blocks; and (iv) when the refresh operation in the first refresh mode is initiated and data is being read from or written to one block from among the plurality of blocks, the refresh operation is performed on blocks other than the block from or to which the data is being read or written, and the refresh operation is performed on the block from or to which the data is being read or written upon completion of the read or write operation on the block.

7. A method according to claim 6, wherein the first operating mode includes a read/write cycle wherein at least one of reading and writing of data from and to the semiconductor memory device is enabled; and the second operating mode includes a power saving mode wherein reading and writing of data from and to the semiconductor memory device are disabled, and having lower power consumption than the first operating mode.

8. A method according to claim 6, wherein the external timing signal is a clock signal;

the read/write cycle is performed in sync with the clock signal in the first operating mode; and in the first refresh mode the refresh operation is performed in sync with the clock signal, after the refresh timing signal has been generated.

9. A method according to claim 8, wherein, when the semiconductor memory device is in the first operating mode, the clock signal is supplied to predetermined circuits within the semiconductor memory device, and when the semiconductor memory device is in the second operating mode the supply of the clock signal to the predetermined circuits is suspended.

10. A method according to claim 9 wherein the second operating mode is a mode with a lowest level of power consumption by the semiconductor memory device.

* * * * *